United States Patent
Nagai

(10) Patent No.: US 8,274,152 B2
(45) Date of Patent: Sep. 25, 2012

(54) SEMICONDUCTOR DEVICE HAVING A CONTACT HOLE EXTENDING FROM AN UPPER SURFACE OF AN INSULATING FILM AND REACHING ONE OF A PLURALITY OF IMPURITY REGIONS CONSTITUTING A TRANSISTOR AND METHOD OF MANUFACTURING THE SAME

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 547 days.

(21) Appl. No.: 11/600,210

(22) Filed: Nov. 16, 2006

(65) Prior Publication Data

US 2008/0001291 A1  Jan. 3, 2008

(30) Foreign Application Priority Data

Jun. 30, 2006 (JP) ................. 2006-181953

(51) Int. Cl.
*H01L 23/52* (2006.01)
(52) U.S. Cl. ........ 257/758; 257/773; 257/774; 257/295; 257/296; 257/E27.103; 257/E27.104; 438/3; 438/238; 438/239; 438/250; 438/393
(58) Field of Classification Search .................. 257/758, 257/295, 296, 773, 774, E27.103, E27.104; 438/800, 3, 238, 239, 250, 393, 394
See application file for complete search history.

(56) References Cited

U.S. PATENT DOCUMENTS

| 6,495,879 | B1 | 12/2002 | Kobayashi |
| 6,611,014 | B1 | 8/2003 | Kanaya et al. |
| 6,964,890 | B1 * | 11/2005 | Yamazaki et al. ............ 438/166 |
| 7,288,799 | B2 | 10/2007 | Saigoh et al. |
| 7,781,812 | B2 | 8/2010 | Izumi |
| 2003/0089954 | A1 * | 5/2003 | Sashida ...................... 257/369 |
| 2004/0084701 | A1 | 5/2004 | Kanaya et al. |

(Continued)

FOREIGN PATENT DOCUMENTS

JP  2000-164817 A  6/2000

(Continued)

OTHER PUBLICATIONS

Japanese Office Action dated Feb. 8, 2011, issued in corresponding Japanese Patent Application No. 2006-181953.

(Continued)

*Primary Examiner* — Ha Tran T Nguyen
*Assistant Examiner* — Suberr Chi
(74) *Attorney, Agent, or Firm* — Westerman, Hattori, Daniels & Adrian, LLP

(57) ABSTRACT

A transistor is formed on a semiconductor substrate, and thereafter a first insulating film is formed. Subsequently, a ferroelectric capacitor is formed on the first insulating film, and then a second insulating film is formed on the ferroelectric capacitor. Thereafter, the upper surface of the second insulating film is planarized. Subsequently, a contact hole which reaches one of impurity regions of the transistor is formed, and thus a plug is formed by embedding a conductor in the contact hole. Thereafter, a hydrogen barrier layer is formed of aluminum oxide or the like. Then, a third insulating film is formed on the hydrogen barrier layer. Subsequently, contact holes which are connected to the ferroelectric capacitor and the plug are formed. Thereafter, a conductor is embedded in the contact holes, and thus interconnections are formed.

4 Claims, 30 Drawing Sheets

U.S. PATENT DOCUMENTS

| | | |
|---|---|---|
| 2005/0127395 A1 | 6/2005 | Saigoh et al. |
| 2005/0139881 A1 | 6/2005 | Takaya |
| 2005/0145985 A1* | 7/2005 | Takaya .................. 257/532 |
| 2005/0285173 A1 | 12/2005 | Nagai et al. |
| 2006/0249768 A1 | 11/2006 | Izumi |

FOREIGN PATENT DOCUMENTS

| | | |
|---|---|---|
| JP | 2001-358309 A | 12/2001 |
| JP | 2003-100994 A | 4/2003 |
| JP | 2005-175204 A | 6/2005 |
| JP | 2005-191325 A | 7/2005 |
| JP | 2006-49795 A | 2/2006 |
| WO | 2005/101509 A1 | 10/2005 |

OTHER PUBLICATIONS

Japanese Office Action dated Dec. 6, 2011, issued in corresponding Japanese Patent Application No. 2006-181953.(w/partial translation).

* cited by examiner

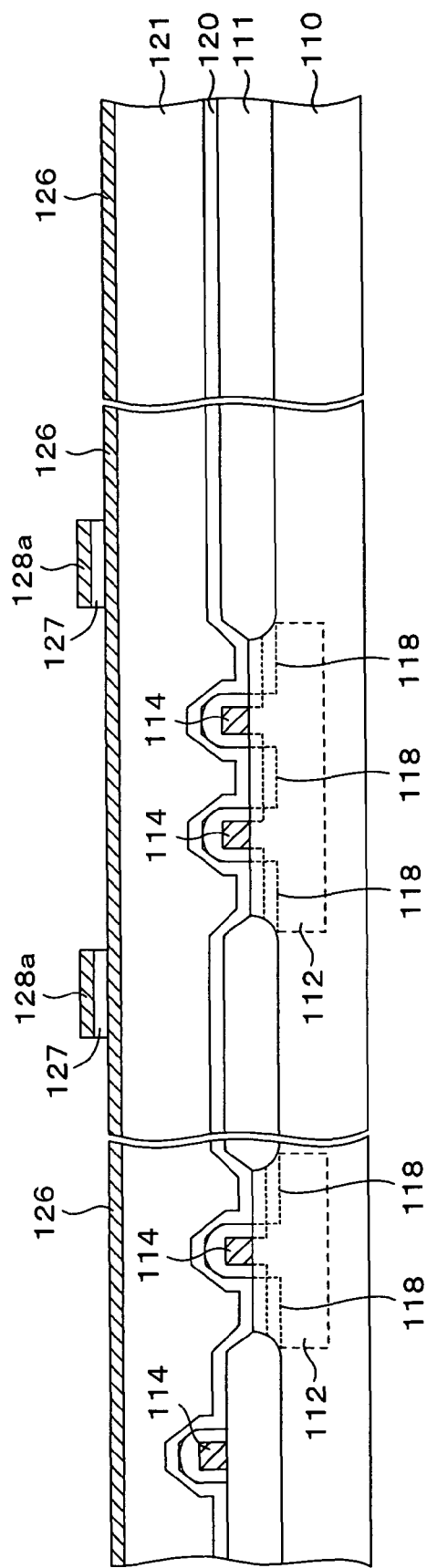

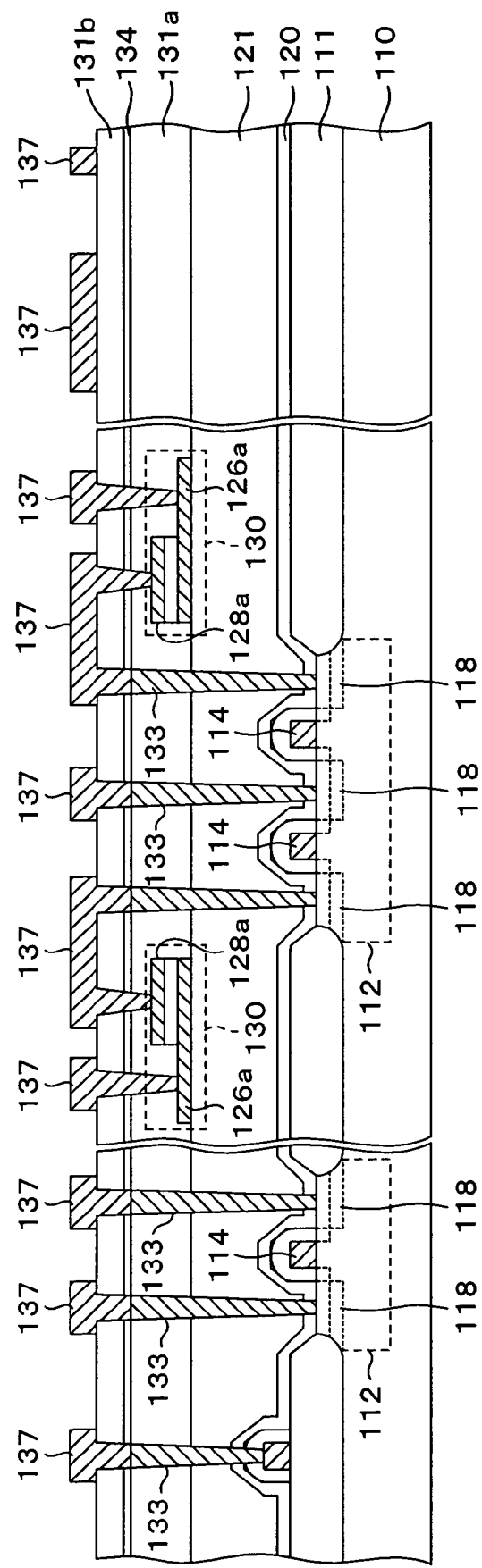

SEMICONDUCTOR DEVICE HAVING A CONTACT HOLE EXTENDING FROM AN UPPER SURFACE OF AN INSULATING FILM AND REACHING ONE OF A PLURALITY OF IMPURITY REGIONS CONSTITUTING A TRANSISTOR AND METHOD OF MANUFACTURING THE SAME

CROSS-REFERENCE TO RELATED APPLICATIONS

This application is based on and claims priority of Japanese Patent Application No. 2006-181953 filed on Jun. 30, 2006, the entire contents of which are incorporated herein by reference.

BACKGROUND OF THE INVENTION

1. Field of the Invention

The present invention relates to a semiconductor device including a ferroelectric capacitor configured by interposing a ferroelectric film between a pair of electrodes, and to a method of manufacturing the semiconductor device.

2. Description of the Prior Art

Memories including a ferroelectric capacitor (Ferroelectric Random Access Memories; hereinafter referred to as a "FeRAMs") for storing information by use of hysteresis characteristics of a ferroelectric have been developed in recent years. FeRAMs are non-volatile memories which can retain information when not powered, and exhibit such advantageous characteristics that the FeRAMs can realize high integration, high-speed read and write operations, high endurance, and low power consumption.

Ferroelectric oxides having a perovskite crystal structure are chiefly used as a material for a ferroelectric film of a ferroelectric capacitor. Ferroelectric oxides include PZT (Pt(Zr, Ti)$O_3$) and SBT (SrBi$_2$Ta$_2$O$_9$), each of which has a larger remnant polarization. The remnant polarizations respectively of these ferroelectric oxides are approximately 10 μC/cm$^2$ to 30 μC/cm$^2$.

In the case of a ferroelectric film made of one of the aforementioned oxides, it has been known that moisture reaching the ferroelectric film from the outside through the interlayer dielectric formed of a silicon dioxide film or the like deteriorates the ferroelectric properties of the ferroelectric film. Specifically, once moisture enters an interlayer dielectric formed of silicon dioxide or the like, the moisture is dissolved into hydrogen and oxygen in a film forming step and in other high-temperature steps. Hydrogen produced by dissolution of the moisture enters the ferroelectric film, and reacts on oxygen contained in the ferroelectric film. Hence, oxygen defects arise, and accordingly crystallizability of the ferroelectric film is reduced. As a result, this deterioration decreases the remnant polarization and the dielectric constant of the ferroelectric film, and accordingly deteriorates performance of the ferroelectric capacitor. In an extreme case, it is likely that the entrance of the moisture and the hydrogen may deteriorate not only the performance of the ferroelectric capacitor but also performance of the transistor and the like. In addition, it has been known that, in a case where a FeRAM is used for a long period of time, hydrogen similarly enters the ferroelectric film so that performance of the ferroelectric capacitor is deteriorated.

For the purpose of avoiding such types of performance deterioration, a conventional practice for semiconductor devices each having a ferroelectric capacitor is to form a barrier layer for preventing hydrogen and moisture from entering the ferroelectric film on top of the ferroelectric capacitor and the interconnection layer. For example, aluminum oxide (Al$_2$O$_3$: alumina) is used for this barrier layer.

Japanese Patent Application No. 2003-100994 (hereinafter referred to as "Patent Document 1") discloses the following two points. First, a moisture dispersion preventing layer made of SiN (silicon nitride) or SiON (silicon oxynitride) is formed above an interlayer dielectric covering a ferroelectric capacitor. Second, a hydrogen dispersion preventing layer made of tantalum pentoxide (Ta$_2$O$_3$) or alumina is formed on or under the moisture dispersion preventing layer.

Japanese Patent Application No. 2000-164817 (hereinafter referred to as "Patent Document 2") discloses that, in a case of a ferroelectric memory having a protective film with moisture vapor resistance (a SiN film or a SiO$_2$ film) which is formed on an interlayer dielectric thereof, a protective film made of iridium, alumina or the like is formed between the interlayer dielectric and the protective film with moisture vapor resistance. The type of protective film is used for easing influence on the ferroelectric film of stress generated by contact between the protective film with moisture vapor resistance and the interconnection layer.

Japanese Patent Application No. 2005-191325 (hereinafter referred to as "Patent Document 3") describes a ferroelectric memory having a moisture dispersion preventing film made of SiN or SiON which is formed on the interlayer dielectric thereof. According to Patent Document 3, an interconnection connected to the transistor is formed on the moisture dispersion preventing film, and this formation prevents moisture from entering the ferroelectric film while the interconnection is being formed.

Japanese Patent Application No. 2006-49795 (hereinafter referred to as "Patent Document 4") describes a semiconductor device including a first hydrogen dispersion preventing film, an interlayer dielectric and a second hydrogen dispersion preventing film. The first hydrogen dispersion preventing film covers the ferroelectric capacitor. The interlayer dielectric is formed on the hydrogen dispersion preventing film, and its surface is planarized. The second hydrogen dispersion preventing film is formed on the interlayer dielectric. According to Patent Document 4, the first and second hydrogen dispersion films are made of aluminum oxide.

Nevertheless, the present applicants have considered that conventional techniques include the following problems. Specifically, in a case of the conventional techniques, a barrier layer made of aluminum oxide is formed directly on the ferroelectric capacitor, for example. Thus, this barrier layer prevents hydrogen and moisture from entering the ferroelectric film. In this case, a step is inevitably caused in the barrier layer, and a gap allowing hydrogen and moisture to enter the ferroelectric film is prone to be caused in a portion including this step in the barrier layer. This is because aluminum oxide exhibits poor drape. For this reason, this type of conventional technique does not bring about an effect of sufficiently preventing degeneration of performance of the ferroelectric capacitor.

In some cases, the barrier is formed on not only the ferroelectric capacitor but also the interconnection layer. In this case, however, a gap allowing hydrogen and moisture to enter the barrier layer is caused because of a step caused in the interconnection layer. As a result, this type of conventional technique can not fully prevent degeneration of properties of the ferroelectric capacitor.

Furthermore, in the case of a conventional type of FeRAM, it is a usual practice that the ferroelectric capacitor is formed after a W (tungsten) plug to be connected to an impurity region (source/drain of a transistor) in the surface of the semiconductor substrate is formed. In this case, it is likely that the W plug may be oxidized while a step of annealing the ferroelectric film is being performed. This type of conventional technique requires a step of forming an insulating film on the W plug before annealing, and a step of removing the insulating film after annealing. This increases the number of steps to be performed.

According to Patent Document 4, the first barrier layer is formed directly on the ferroelectric capacitor, and additionally the second barrier layer is formed after planarizing the surface of the interlayer dielectric on the first barrier layer. In a case where no second barrier layer is formed, moisture in the interlayer dielectric is discharged to the outside while the ferroelectric film is being annealed. However, in a case where the second barrier layer is formed, the existence of the second barrier layer makes it impossible to discharge the moisture in the interlayer dielectric. This brings about a cause of degeneration of properties of the ferroelectric capacitor.

In addition, according to Patent Document 4, a shallow contact hole and a deep contact hole are formed simultaneously. The shallow contact hole extends from the surface of the interlayer dielectric, and reaches the upper electrode of the ferroelectric capacitor. The deep contact hole extends from the surface of the interlayer dielectric, and reaches the plug in the lower layer. It is likely that, while a step of forming this contact hole is being performed, etching may damage the ferroelectric film, and that, as a result, the properties of the ferroelectric capacitor may be deteriorated.

SUMMARY OF THE INVENTION

With the foregoing matters taken into consideration, an object of the present invention is to provide a semiconductor device and a method of manufacturing the semiconductor device, both of which make it possible to more securely prevent degeneration of performance of a ferroelectric capacitor stemming from entrance of moisture or hydrogen, and to avoid an increase of the number of manufacturing steps.

A first aspect of the present invention is to provide a semiconductor device including a semiconductor substrate, a transistor, a first insulating film, a ferroelectric capacitor, a second insulating film, a first contact hole, a plug, a hydrogen barrier layer, a third insulating film, a second contact hole, a third contact hole and interconnections. The transistor is formed on the semiconductor substrate. The first insulating film is formed on the semiconductor substrate, and thus covers the transistor. The ferroelectric capacitor is formed on the first insulating film. The second insulating film covers the upper side of the ferroelectric capacitor, and the upper surface of the second insulating film is planarized. The first contact hole extends from the upper surface of the second insulating film, and reaches one of impurity regions constituting the transistor. The plug is formed by embedding a conductor in the first contact hole, and is electrically connected to the impurity region. The hydrogen barrier layer is formed on the second insulating film, and thus prevents hydrogen and moisture from entering a portion under the hydrogen barrier layer. The third insulating film is formed on the hydrogen barrier layer. The second contact hole extends from the upper surface of the third insulating film, and communicates with the ferroelectric capacitor. The third contact hole extends from the upper surface of the third insulating film, and communicates with the plug. The interconnections are formed on the third insulating film. One of the interconnections is connected to the ferroelectric capacitor through the second contact hole. Other one of the interconnections is connected to the plug through the third contact hole.

In the case of the present invention, the upper surface of the second insulating film formed on the ferroelectric capacitor is planarized, and the hydrogen barrier layer is formed on the second insulating film. In the case of the present invention, specifically, no step exists in the upper surface of the second insulating film serving as a base of the hydrogen barrier layer. This prevents occurrence of a gap allowing hydrogen and moisture to enter thereto, even if the hydrogen barrier layer is formed of a material, such as aluminum oxide, which exhibits poor drape. As a result, this prevents properties of the ferroelectric capacitor from degenerating due to hydrogen and moisture, and thus enhances reliability of the semiconductor device.

Another aspect of the present invention is to provide a method of manufacturing a semiconductor device, which includes the steps of: forming a transistor on a semiconductor substrate; forming a first insulating film, covering the transistor, on the semiconductor substrate; forming a ferroelectric capacitor on the first insulating film, the ferroelectric capacitor being configured of a lower electrode, a ferroelectric film and an upper electrode; forming a second insulating film, covering the ferroelectric capacitor, on the first insulating film; planarizing the upper surface of the second insulating film; forming a first contact hole which extends from the upper surface of the second insulating film, and which reaches one of impurity regions constituting the transistor; forming a plug by embedding a conductor in the first contact hole, the plug being electrically connected to the impurity region; forming a hydrogen barrier layer on the second insulating film, the hydrogen barrier layer being that which prevents hydrogen and moisture from entering a portion under the hydrogen barrier layer; forming a third insulating film on the hydrogen barrier layer; forming second contact holes which extend from the upper surface of the third insulating film, and which respectively reach the upper electrode and the lower electrode of the ferroelectric capacitor; performing a recovery annealing process on the ferroelectric capacitor; forming a third contact hole which extends from the upper surface of the third insulating film, and which reaches the plug; and forming interconnections on the third insulating film, two of the interconnections being electrically connected respectively to the upper electrode and the lower electrode of the ferroelectric capacitor through the second contact holes, and other one of the interconnections being electrically connected to the plug through the third contact hole.

In the case of the present invention, after the ferroelectric capacitor is formed, the second insulating film to cover the top of this ferroelectric capacitor is formed. Subsequently, the upper surface of the second insulating film is planarized. Thereafter, the contact hole which extends from the upper surface of the second insulating film, and which reaches the impurity region (source/drain region) of the transistor, is formed. The plug is formed by embedding the conductor in the contact hole. In other words, in the case of the present invention, the formation of the ferroelectric capacitor is completed before the plug is going to be formed. This makes unnecessary a step of forming an insulating film for preventing oxidation of the plug which would otherwise occur while the ferroelectric film is being annealed. This accordingly makes unnecessary a step of removing the insulating film.

In addition, in the case of the present invention, a hydrogen barrier layer made of aluminum oxide or the like does not exist between the upper surface of the second insulating film and each of the impurity regions of the transistor. This makes it possible to easily form the contact holes which extend from the upper surface of the second insulating film, and which reach the respective impurity regions of the transistor. Note that, in a case where a single hydrogen barrier layer made of aluminum oxide or the like exists between the upper surface of the second insulating film and each of the impurity regions of the transistor, it is possible to relatively easily form the contact holes which extend from the upper surface of the second insulating layer, and which reach the respective impurity regions of the transistor. In a case, however, where two or more hydrogen barrier layers each made of aluminum oxide or the like exist between the upper surface of the second insulating film and each of the impurity regions of the transistor, it is difficult to form the contact holes which extend from the upper surface of the second insulating film, and which reach the respective impurity regions of the transistor.

Yet another aspect of the present invention is to provide a semiconductor device including a semiconductor substrate, a transistor, a first insulating film, a first contact hole, a first plug, a ferroelectric capacitor, a second insulating film, a second contact hole, a second plug, a hydrogen barrier layer, a third insulating film, a third contact hole, and an interconnection. The transistor is formed on the semiconductor substrate. The first insulating film is formed on the semiconductor substrate, and thus covers the transistor. The first contact hole extends from the upper surface of the first insulating film, and reaches one of impurity regions constituting the transistor. The first plug is formed by embedding a conductor in the first contact hole, and is electrically connected to the impurity region. The ferroelectric capacitor is arranged on the first plug, and a lower electrode of the ferroelectric capacitor is electrically connected to the first plug. The second insulating film is formed on the first insulating film, and thus covers the ferroelectric capacitor. The upper surface of the second insulating film is planarized. The second contact hole extends from the upper surface of the second insulating film, and reaches an upper electrode of the ferroelectric capacitor. The second plug is formed by embedding a conductor in the second contact hole, and is electrically connected to the upper electrode. The hydrogen barrier layer is formed on the second insulating film, and thus prevents hydrogen and moisture from entering a portion under the hydrogen barrier layer. The third insulating film is formed on the hydrogen barrier layer. The third contact hole extends from the upper surface of the third insulating film, and communicates with the second plug. The interconnection is formed in the third insulating film, and is electrically connected to the second plug through the third contact hole.

In the case of the present invention, as well, the upper surface of the second insulating film covering the ferroelectric capacitor is planarized, and the hydrogen barrier layer is formed on the second insulating film. For this reason, no step exists in the hydrogen barrier layer. This prevents occurrence of a gap allowing hydrogen and moisture to enter thereto.

Still another aspect of the present invention is to provide a method of manufacturing a semiconductor device, which includes the steps of: forming a transistor on a semiconductor substrate; forming a first insulating film, covering the transistor, on the semiconductor substrate; forming a first contact hole which extends from the upper surface of the first insulating film, and which reaches one of impurity regions constituting the transistor; forming a first plug by embedding a conductor in the first contact hole, the first plug being electrically connected to the impurity region; forming a ferroelectric capacitor on the first insulating film, the ferroelectric capacitor being configured of a lower electrode electrically connected to the first plug, a ferroelectric film formed on the lower electrode, and an upper electrode formed on the ferroelectric film; forming a second insulating film on the first insulating film, the second insulating film covering the ferroelectric capacitor; planarizing the upper surface of the second insulating film; forming a second contact hole which extends from the upper surface of the second insulating film, and which reaches the upper electrode of the ferroelectric capacitor; forming a second plug by embedding a conductor in the second contact hole; forming a hydrogen barrier layer on the second insulating film, the hydrogen barrier layer being that which prevents hydrogen and moisture from entering a portion under the hydrogen barrier layer; forming a third insulating film on the hydrogen barrier layer; forming a third contact hole which extends from the upper surface of the third insulating film, and which reaches the second plug; and forming an interconnection on the third insulating film, the interconnection being electrically connected to the second plug through the third contact hole.

In the case of the present invention, after the first insulating film covering the transistor is formed, the first contact hole which extends from the upper surface of the first insulating film, and which reaches the impurity region (source/drain region) of the transistor, is formed. Thus, the conductor is embedded in the first contact hole, and thereby the first plug is formed. Subsequently, the lower electrode of the ferroelectric capacitor is formed on the first plug, and the ferroelectric film and the upper electrode are formed thereon. Thereby, the ferroelectric capacitor is completed. In an annealing step during the formation of the ferroelectric capacitor, the formation of the lower electrode on the first plug prevents the first plug from being oxidized.

Subsequently, the second insulating film to cover the ferroelectric capacitor is formed. Thereafter, the upper surface of the second insulating film is planarized. After that, the second contact hole which extends from the upper surface of the second insulating film, and which reaches the upper electrode of the ferroelectric capacitor, is formed. The conductor is embedded in the second contact hole, and thereby the second plug is formed. The ferroelectric capacitor is not oxidized by annealing. This is because the second capacitor is formed after the ferroelectric capacitor is formed.

Thereafter, the hydrogen barrier layer is formed of aluminum oxide or the like on the second insulating film, and then the third insulating film is formed on the hydrogen barrier layer. Subsequently, the third contact hole which extends from the upper surface of the third insulating film, and which reaches the second plug, is formed. Thence, the interconnection electrically connected to the second plug through the third contact hole is formed on the third insulating film.

In the case of the present invention, it is unlikely that the plug is oxidized by annealing in the step of forming the ferroelectric capacitor. This makes unnecessary a step of forming an insulating film, which would otherwise be needed, for oxidation prevention on the plug before annealing, and a step of removing the insulating film for oxidation prevention after annealing. This makes the manufacturing steps simpler than before.

DESCRIPTION OF THE PREFERRED EMBODIMENT

Descriptions will be provided hereinafter for the embodiments of the present invention by referring to the attached drawings.

First Embodiment

Figure 1:
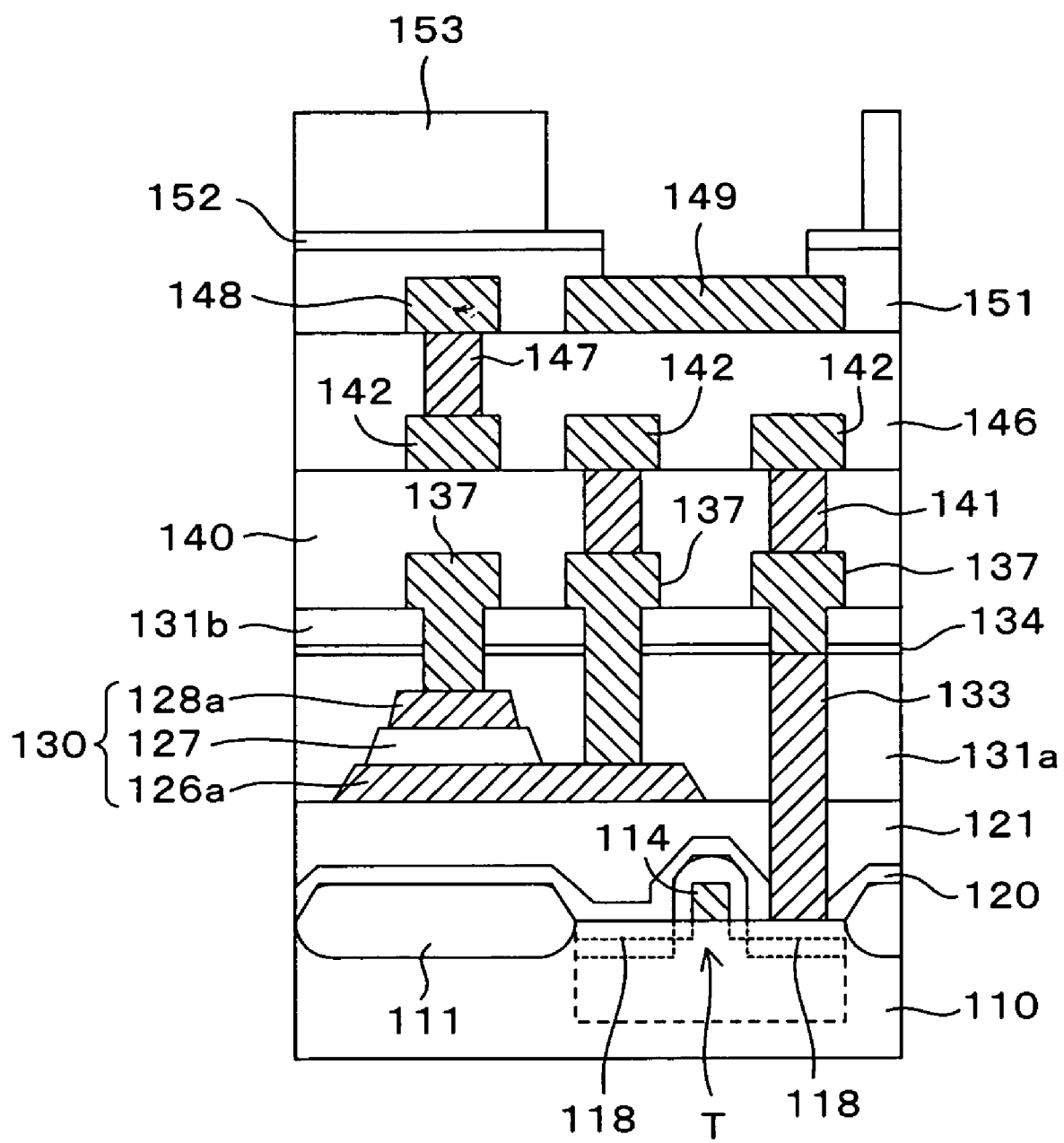
FIG. 1 is a schematic diagram showing a configuration of a semiconductor device according to a first embodiment of the present invention.

FIG. 1 is a schematic diagram showing a configuration of a semiconductor device according to a first embodiment of the present invention. A semiconductor substrate 110 is separated into a plurality of element regions by an element separation film 111. A transistor T is configured of a pair of high-concentration impurity regions 118, a gate insulating film (not illustrated) and a gate electrode 114. The pair of high concentration impurity regions 118 are formed by selectively implanting impurities into the semiconductor substrate 110. The gate insulating film is formed on a region between the pair of high-concentration impurity regions 118. The gate electrode 114 is formed on the gate insulating film. A stopper layer 120 is formed on the semiconductor substrate 110. Thus, the transistor T and the element separation film 111 are covered with this stopper layer 120. In addition, an interlayer dielectric (first insulating film) 121 is formed on the stopper layer 120. The upper surface of the interlayer dielectric 121 is planarized.

A ferroelectric capacitor 130 is formed on the interlayer dielectric 121. The ferroelectric capacitor 130 has a structure in which a lower electrode 126a, a ferroelectric film 127 and an upper electrode 128a are stacked on one another in this order from the bottom. This ferroelectric capacitor 130 is covered with an interlayer dielectric (second insulating film) 131a. The upper surface of this interlayer dielectric 131a is planarized. A barrier layer (hereinafter referred as to a "hydrogen barrier layer") 134 for preventing hydrogen and moisture from entering a portion under the hydrogen barrier layer is formed on the planarized upper surface of the interlayer dielectric 131a. In the case of the present embodiment, the hydrogen barrier layer 134 is formed of aluminum oxide.

In the case of the semiconductor device according to the present embodiment, a W (tungsten) plug 133 is formed. The W plug 133 extends from the upper surface of the interlayer dielectric 131a, and reaches one of the pair of high-concentration impurity regions 118 of the transistor T. An interlayer dielectric (third insulating film) 131b is formed on the hydrogen barrier layer 134. A plurality of interconnections 137 in a first interconnection layer are formed on the interlayer dielectric 131b. One of the interconnections 137 is electrically connected to the upper electrode 128a through a conductor (wiring material) embedded in a contact hole which extends from the upper surface of the interlayer dielectric 131b, and which communicates with the upper electrode 128a of the ferroelectric capacitor 130. Another of the interconnections 137 is electrically connected to the lower electrode 126a through a conductor (wiring material) embedded in a contact hole which extends from the upper surface of the interlayer dielectric 131b, and which communicates with the lower electrode 126a of the ferroelectric capacitor 130. The other of the interconnections 137 is electrically connected to the W plug 133 through a conductor (wiring material) embedded in a contact hole which penetrates through the interlayer dielectric 131b and the hydrogen barrier layer 134.

An insulating dielectric 140 is formed on the interconnections 137 in the first interconnection layer and on the interlayer dielectric 131b. A plurality of W plugs 141 are formed in this interlayer dielectric 140. The W plugs 141 penetrate through the interlayer dielectric 140 in the vertical direction, and are electrically connected respectively to the interconnections 137 in the first interconnection layer. In addition, a plurality of interconnections 142 in a second interconnection layer are formed on the interlayer dielectric 140. As shown in FIG. 1, predetermined interconnections of these interconnections 142 are electrically connected respectively to the interconnections 137 in the first interconnection layer through the corresponding W plugs 141.

An interlayer dielectric 146 is formed on the interconnections 142 in the second interconnection layer and on the interlayer dielectric 140. A plurality of W plugs 147 (one W plug 147 only shown in FIG. 1) are formed in this interlayer dielectric 146. The W plugs 147 penetrate through the interlayer dielectric 146 in the vertical direction, and are electrically connected respectively to the interconnections 142 in the second interconnection layer. Moreover, interconnections 148 in a third interconnection layer and terminals 149 are formed on the interlayer dielectric 146. Predetermined interconnections of these interconnections 148 in the third interconnection layer are electrically connected respectively to the interconnections 142 in the second interconnection layer through the corresponding W plugs 147.

A first passivation film 151, a second passivation film 152 and a protection film 153 are stacked on one another, in this order from the bottom, on the interconnections 148 in the third interconnection layer and on the interlayer dielectric 146. Subsequently, parts of the first passivation film 151, the second passivation film 152 and the protection film 153 on the terminals 149 are selectively removed, and thus the upper surface of the terminals 149 is exposed to the outside.

The semiconductor device according to the present embodiment has characteristics as described above. The characteristics will be cited again here. First, the upper surface of the interlayer dielectric 131a covering the ferroelectric capacitor 130 is planarized. Second, the hydrogen barrier layer 134 made of aluminum oxide is formed on the interlayer dielectric 131a. Third, the predetermined interconnections of the interconnections 137 in the first interconnection layer are electrically connected respectively to the upper electrode 128a and the lower electrode 126a of the ferroelectric capacitor 130 through the corresponding contact holes. Fourth, the W plug 133 is formed so that the W plug 133 penetrates through the interlayer dielectrics 131a and 121, and thus electrically connects one of the interconnection 137 in the first interconnection layer to one of the high-concentration impurity regions 118 in the surface of the semiconductor substrate 110.

In the case of the semiconductor device according to the present embodiment, the hydrogen barrier layer 134 made of aluminum oxide is formed on the planarized surface of the interlayer dielectric 131a. For this reason, it is unlikely that a gap allowing moisture and hydrogen to permeate the hydrogen barrier layer 134 occurs between the hydrogen barrier layer 134 and the interlayer dielectric 131a. This prevents the properties of the ferroelectric capacitor 130 from degenerating due to entrance of moisture and hydrogen from the outside.

Moreover, in the case of the present invention, the W plug 133 is formed so that the W plug 133 penetrates through the interlayer dielectrics 121 and 131a, and thus is electrically connected to one of the high-concentration impurity regions 118 in the upper surface of the semiconductor substrate 110. This makes it possible to determine conditions required for etching depending on how deep the contact holes communicating with the ferroelectric capacitor 130 is to the ferroelectric capacitor 130, when the contact holes are formed in the interlayer dielectric 131a. As a result, this prevents the properties of the ferroelectric capacitor 130 from degenerating due to excessive etching.

Figure 2A:
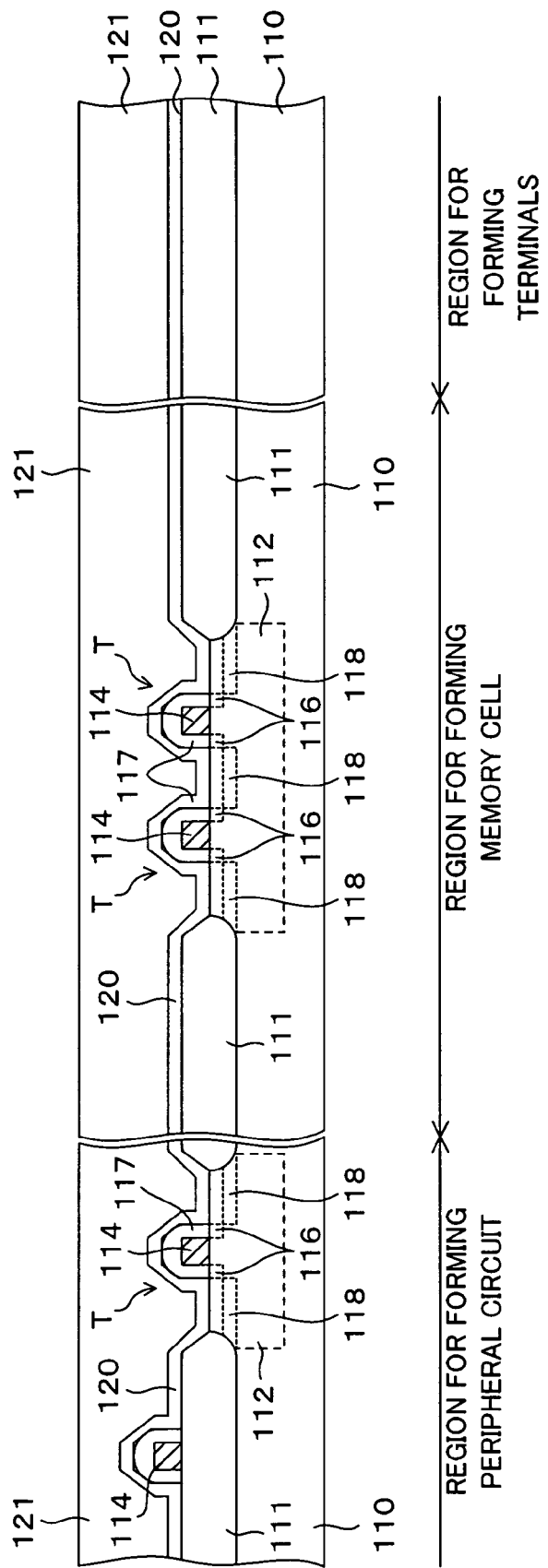
FIGS. 2A to 2O are cross-sectional views showing a method of manufacturing the semiconductor device according to the first embodiment of the present invention.

FIGS. 2A to 2O are cross-sectional views showing a method of manufacturing the semiconductor device according to the first embodiment of the present invention. Note that descriptions will be provided below for an example where the present invention is applied to a method of manufacturing a planar FeRAM. In addition, FIGS. 2A and 2O show cross-sectional views of a region for forming a peripheral circuit, a region for forming a memory cell and a region for forming terminals. Furthermore, in the case of the present embodiment, the memory cell is configured of an n type transistor.

First of all, descriptions will be provided for steps of and before forming a structure shown in FIG. 2A. An element separation film 111 is formed in a predetermined area in a semiconductor substrate (silicon substrate) 110 by use of the publicly-known LOCOS (Local Oxidation of Silicon) method. Thus, the semiconductor substrate 110 is separated into a plurality of element regions by this element separation film 111. The element separation film 111 may be formed by use of the publicly-known STI (Shallow Trench Isolation) method.

Subsequently, regions each for forming an n type transistor in the semiconductor substrate 110 (regions each for forming an n type transistor in the region for forming a memory cell and the region for forming a peripheral circuit; hereinafter, the same regions will be referred to in the same manner) are doped with p type impurities such as boron (B). Thus, p wells 112 are formed. In addition, a region for forming a p type transistor in the semiconductor substrate 110 (a region for forming a p type transistor in the region for forming the peripheral circuit; hereinafter, the same region will be referred to in the same manner) is doped with n type impurities such as phosphorus (P). Thus, an n well (not illustrated) is formed.

Thereafter, the upper surfaces respectively of the p wells 112 and the n well (not illustrated) are thermally oxidized, and thus gate insulating films (not illustrated) are formed. Subsequently, a polysilicon film is formed on the entire upper surface of the resultant semiconductor substrate 110 by use of the CVD (Chemical Vapor Deposition) method. Thereafter, this polysilicon film is patterned by the photolithographic method, and thus gate electrodes (polysilicon interconnections) 114 are formed.

Note that, it is desirable that gate electrodes doped with n type impurities be formed above the respective p wells 112, and that a gate electrode doped with p type impurities be formed above the n well (not illustrated). In addition, as shown in FIG. 2A, two gate electrodes 114 are arranged in parallel on a single p well 112 in the region for forming a memory cell.

Subsequently, the gate electrodes 114 are used as masks, and thus ions of n type impurities such as phosphorus (P) or arsenic (As) are shallowly implanted in the p wells 112 in the regions each for forming the n type transistor. Thus, n type low-concentration impurity regions 116 are formed. Similarly, the gate electrode 114 is used as a mask, and thus ions of p type impurities such boron (B) are shallowly implanted in the n well (not illustrated) in the region for forming the p type transistor. Hence, a p type low-concentration impurity region (not illustrated) is formed.

Thereafter, sidewalls 117 are formed at the two sides of each of the gate electrodes 114. These sidewalls 117 are formed in the following manner. An insulating film made of $SiO_2$, SiN or the like is formed on the entire upper surface of the semiconductor substrate 110 by use of the CVD method. Thereafter, the insulating film is etched back to form the sidewalls 117.

Subsequently, the gate electrodes 114 and the sidewalls 117 are used as masks, and thus ions of n type impurities such as phosphorus (P) or arsenic (As) are implanted in the p wells 112 respectively in the regions each for forming the n type transistor. Hence, n type high-concentration impurity regions 118 are formed. Similarly, the gate electrode and the sidewalls in the region for forming the p type transistor are used as masks, and thus ions of p type impurities such as boron (B) are implanted in the n well (not illustrated). Hence, a p type high-concentration impurity region (not illustrated) is formed. In this manner, a transistor T having a source/drain of the LDD (Lightly Doped Drain) structure is formed in each of the regions for forming the n type and p type transistors.

Incidentally, it is desirable that a layer made of metal silicide such as cobalt silicide or titanium silicide be formed as a contact layer on the upper surface of the gate electrodes 114 and the n type high-concentration impurity regions 118.

Subsequently, for example, a SiON film is formed as a stopper layer 120 with a thickness of 200 nm on the entire upper surface of the resultant semiconductor substrate 110 by use of the plasma CVD method. In addition, for example, a TEOS-NSG (Tetra-Ethyl-Ortho-Silicate-Nondoped Silicate Glass: SiO) film is formed as an interlayer dielectric 121 with a thickness of 600 nm on the stopper layer 120 by use of the plasma CVD method. Thereafter, the upper surface of the interlayer dielectric 121 is planarized by polishing the upper surface up to the depth of approximately 200 nm by use of the CMP (Chemical Mechanical Polishing) method.

Figure 2B:
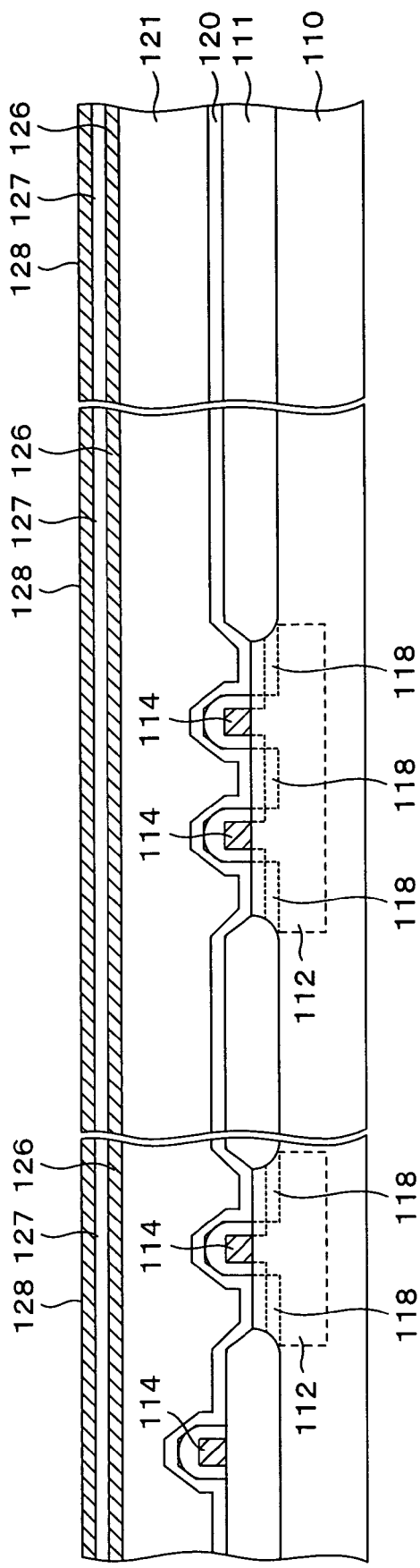

Descriptions will be provided next for steps of and before forming a structure shown in FIG. 2B. After the step of planarizing the upper surface of the interlayer dielectric 121, a conductor film 126 to serve as the lower electrodes respectively of the ferroelectric capacitors is formed on the interlayer dielectric 121. This conductor film 126 is formed, for example, of a metal such as Pt (platinum), Ir (iridium), Ru (ruthenium), Rh (rhodium), Re (rhenium), Os (osmium) or Pd (palladium). Otherwise, the conductor film 126 is formed of an oxide (conductive oxide) of one of these metals. In the case of the present embodiment, the conductor film 126 is formed by depositing Pt with a thickness of 155 nm on the interlayer dielectric 121 by use of the PVD (Physical Vapor Deposition) method.

Subsequently, a ferroelectric film 127 is formed on the conductor film 126. The ferroelectric film 127 may be formed of PZT, PLZT, BLT, SBT or the like. In the case of the present embodiment, the ferroelectric film 127 is formed by depositing PZT with a thickness of 150 nm to 200 nm on the conductor film 126 by use of the PVD method.

After the ferroelectric film 127 is formed in the foregoing manner, the ferroelectric film 127 is crystallized by performing a RTA (Rapid Thermal Annealing) process on the ferroelectric film 127 in an atmosphere containing oxygen. In the case of the present embodiment, the ferroelectric film 127 is heated at a temperature of 585° C. for 90 seconds while an oxygen gas is being supplied at flow rate of 0.025 liters per minute to the RTA apparatus.

Thereafter, a conductor film 128 to serve as the upper electrode of each of the ferroelectric capacitors is formed on each of corresponding one of the ferroelectric film 127. The conductor film 128 is formed, for example, of a metal such as Pt, Ir, Ru, Rh, Re, Os or Pd. Otherwise, the conductor film 128 is formed of an oxide (conductive oxide) of one of these metals. In the case of the present embodiment, the conductor film 128 is formed by depositing $IrO_2$ on each corresponding one of the ferroelectric film 127 twice. Specifically, a first $IrO_2$ film is formed by depositing $IrO_2$ with a thickness of 50 nm on the ferroelectric film 127 by use of the PVD method. Thereafter, the resultant semiconductor substrate 110 is placed in an RTA apparatus. The RTA process is performed on the resultant semiconductor substrate 110 with the following conditions: the flow rate of an oxygen gas is 0.025 liters per minute; the temperature is 725° C.; and the process time is 20 seconds. Subsequently, a second $IrO_2$ film is formed by depositing $IrO_2$ with a thickness of 200 nm on each corresponding one of the first $IrO_2$ films by use of the PVD method. In this manner, the conductor film 128 with the structure in which the first and the second $IrO_2$ films are stacked on one after another is formed.

Descriptions will be provided next for steps of and before forming a structure shown in FIG. 2C. After the step of forming the conductor film 128, a resist film covering the above of regions each for forming the upper electrode of a ferroelectric capacitor is formed. Thereafter, the resist film is used as a mask, and thus the conductor film 128 is etched. Hence, the upper electrodes 128a are formed. Subsequently, the resist film on each of the upper electrodes 128a is removed.

After that, a recovery annealing process is applied to the ferroelectric film 127. Specifically, the resultant semiconductor substrate 110 is placed in a heating furnace, and thus a thermal process is applied to the resultant semiconductor substrate 110 with the following conditions: the feed rate of oxygen is 20 liters per minute; the temperature is 650° C.; and the process time is 60 minutes.

After the recovery annealing process is applied to the ferroelectric film 127, resist films covering the above of the regions each for forming the ferroelectric capacitor are formed by use of the photolithographic method. Subsequently, the resist film is used as a mask, and thus the ferroelectric film 127 is etched. Thereafter, the resist film is removed from the tops of the remaining ferroelectric films 127.

Subsequently, the resultant semiconductor substrate 110 is placed in a heating furnace, and thus a recovery annealing process is applied to the ferroelectric films 127. This recovery annealing process is carried out with the following conditions. For example, the feed rate at which oxygen is supplied to the heating furnace is 20 liters per minute, the temperature is 350° C., and the process time is 60 minutes.

Figure 2D:
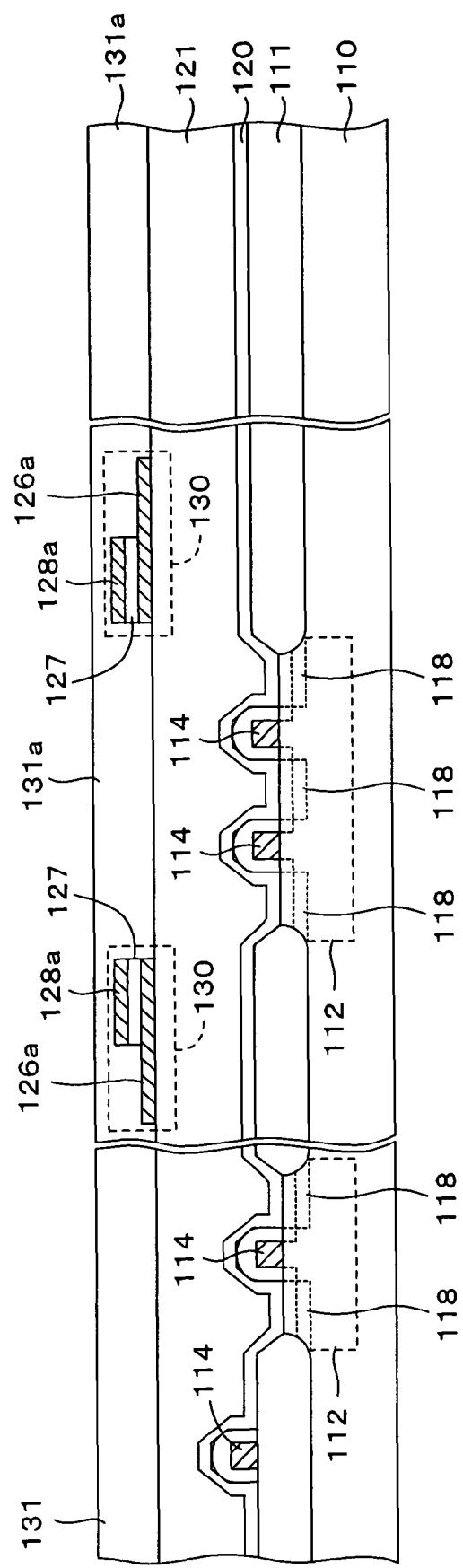

Descriptions will be provided next for steps of and before forming a structure shown in FIG. 2D. After the foregoing step of patterning the ferroelectric films 127, resist films covering the above of regions for forming the lower electrodes of the ferroelectric capacitors are formed. Subsequently, these resist film are used as a mask, and thus the conductor film 126 is etched. Hence, the lower electrodes 126a are formed. Thereafter, the resist films above the lower electrodes 126a are removed.

After that, the resultant semiconductor substrate 110 is placed in a heating furnace, and thus a recovery annealing process is applied to the ferroelectric films 127. This recovery annealing process is carried out with the following conditions. For example, the feed rate at which oxygen is supplied to the heating furnace is 20 liters per minute, the temperature is 650° C., and the process time is 60 minutes. In the foregoing manner, the ferroelectric capacitors 130 are completed.

Subsequently, an interlayer dielectric 131a is formed by depositing TEOS-NSG with a thickness of 1500 nm on the entire upper surface of the resultant semiconductor substrate 110, for example, by use of the plasma CVD method. Thus, the ferroelectric capacitors 130 are covered with this interlayer dielectric 131a. Thereafter, the upper surface of the interlayer dielectric 131a is planarized by polishing the upper surface by use of the CMP method.

Figure 2E:
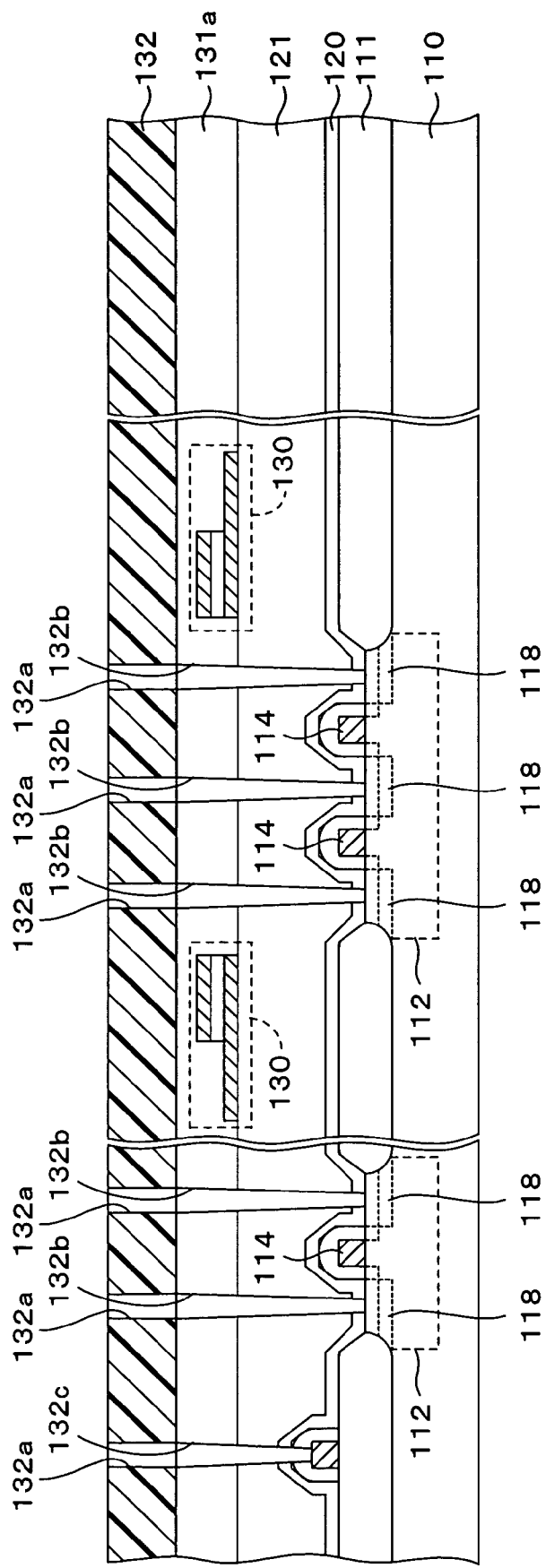

Descriptions will be provided next for steps of and before forming a structure shown in FIG. 2E. After the step of planarizing the upper surface of the interlayer dielectric 131a, a photoresist film 132 is formed by applying a photoresist to the top of the interlayer dielectric 131a. Subsequently, this photoresist film 132 is exposed to light, and is thus developed. Hence, opening portions 132a are formed respectively in predetermined positions. Thereafter, an etching process is performed on the resultant semiconductor substrate 110 by using the photoresist film 132 as a mask. Thereby, contact holes 132b are formed. The contact holes extend from the upper surface of the interlayer dielectric 131a, and reach the respective high-concentration impurity regions 118 (sources/drains respectively of the transistors). In this case, it is possible to easily form the contact holes 132b which extend from the upper surface of the interlayer dielectric 131a, and which reach the respective high-concentration impurity regions 118. This is because both the interlayer dielectrics 131a and 121 are formed of SiO (TEOS-NSG).

Note that, as shown in FIG. 2E, in the region for forming the peripheral circuit, a contact hole 132c is formed at the same time as the contact holes 132b are formed. The contact hole 132c extends from the upper surface of the interlayer dielectric 131a, and reaches the gate electrode (polysilicon interconnection) 114 on the element separation film 111. After the contact holes 132b and 132c are formed, the photoresist film 132 is removed.

Figure 2F:
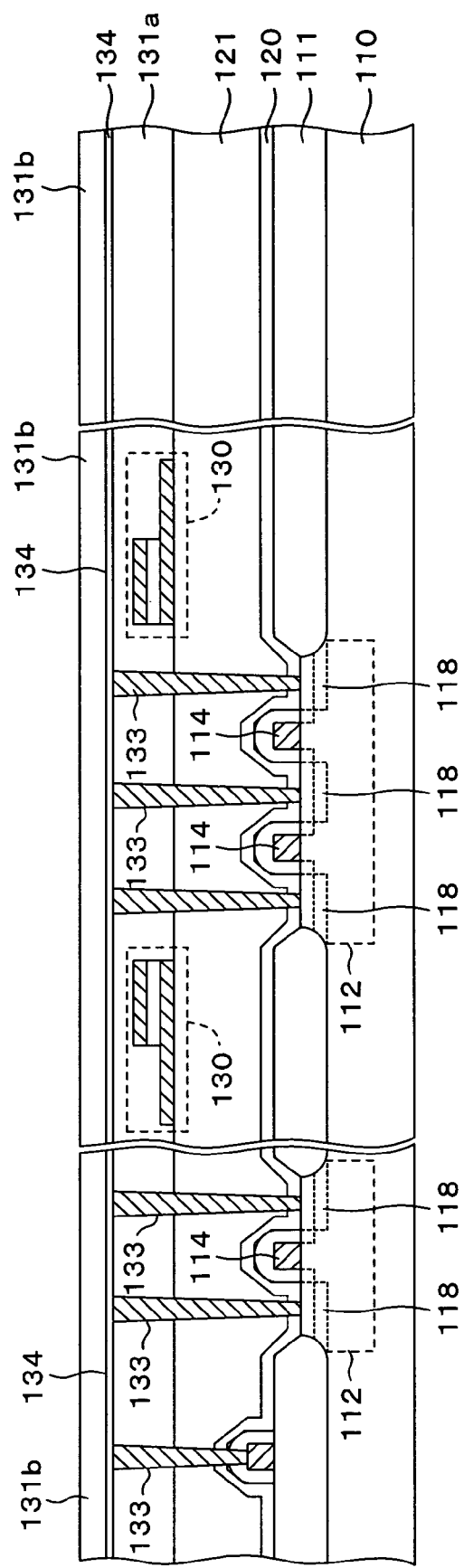

Descriptions will be provided next for steps of and before forming a structure shown in FIG. 2F. After the step of forming the contact holes 132b and 132c, a Ti film with a thickness of 20 nm and a TiN film with a thickness of 50 nm (none of the films are illustrated) are sequentially formed on the entire upper surface of the resultant semiconductor substrate 110, for example, by use of the PVD method. Thereafter, a W (tungsten) film is formed on the interlayer dielectric 131a by depositing W on the entire upper surface of the resultant semiconductor substrate 110, for example, by use of the CVD method, and concurrently W is filled in each of the contact holes 132b and the contact hole 132c.

Subsequently, the W film, the TiN film and the Ti film on the interlayer dielectric 131a are removed by use of the CMP method. In this manner, W plugs 133 which are made by filling W in the contact holes 132b and the contact hole 132c are formed. Thereafter, a hydrogen barrier layer 134 is formed by depositing aluminum oxide with a thickness of approximately 20 nm on the entire upper surface of the resultant semiconductor substrate 110 by use of the PVD method. The hydrogen barrier layer 134 may be formed of a material other than aluminum oxide which has been mentioned above. Examples of the material include titanium oxide (TiOx), tantalum oxide, zirconia, aluminum nitride, tantalum nitride and aluminum oxynitride.

After that, an interlayer dielectric 131b made of $SiO_2$ is formed with a thickness of 50 nm to 100 nm on the hydrogen barrier layer 134, for example, by use of the CVD method.

Figure 2G:
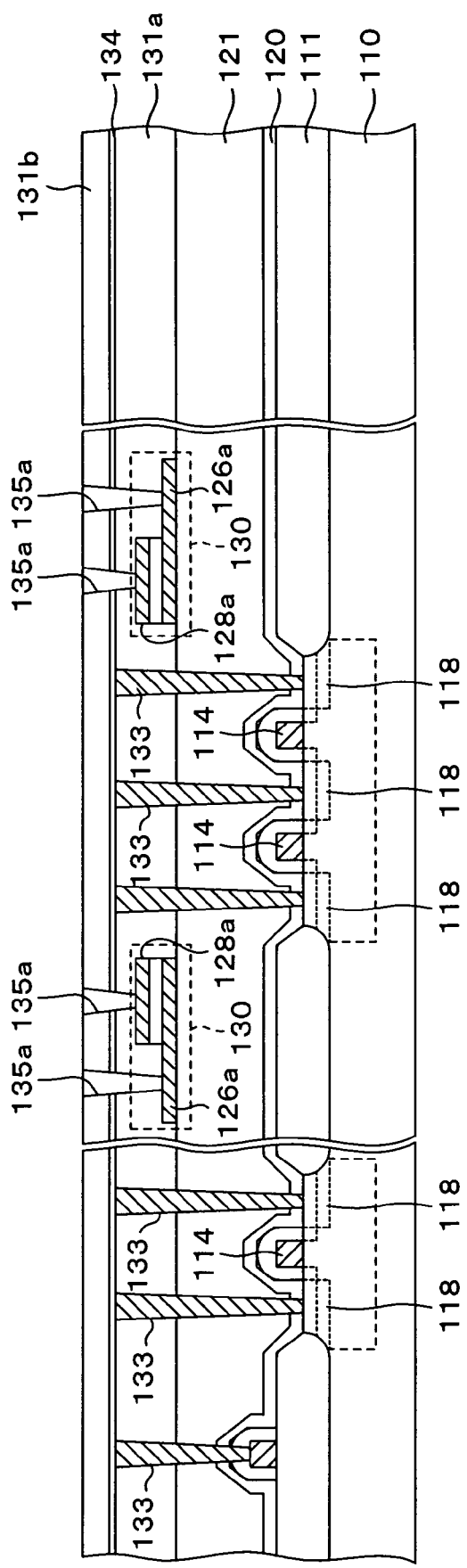

Descriptions will be provided next for steps of and before forming structures shown in FIGS. 2G, 2H, 2I, and 2J, respectively. After the step of forming the interlayer dielectric 131b, a photoresist film (not illustrated) is formed on the interlayer dielectric 131b. Exposure and development processes are applied to the photoresist film, and thus opening portions through which to expose the underneath interlayer dielectric 131b to the outside are formed in predetermined positions. Thereafter, the resultant semiconductor substrate 110 is etched by using the photoresist film as a mask. Thereby, contact holes 135a are formed as shown in FIG. 2G. The contact holes 135a extend from the upper surface of the interlayer dielectric 131b, and communicate respectively with the upper electrodes 128a and the lower electrodes 126a respectively of the ferroelectric capacitors 130. After that, the photoresist film which has been used for forming the contact holes 135a is removed. Subsequently, for the purpose of recovering the ferroelectric films 127 from damage caused by the etching, a recovery annealing process is applied to the ferroelectric films 127. Through the recovery annealing process, the ferroelectric films 127 are heated, for example, at a temperature of 550° C. to 650° C. in an oxygen atmosphere for approximately 60 minutes.

Figure 2H:
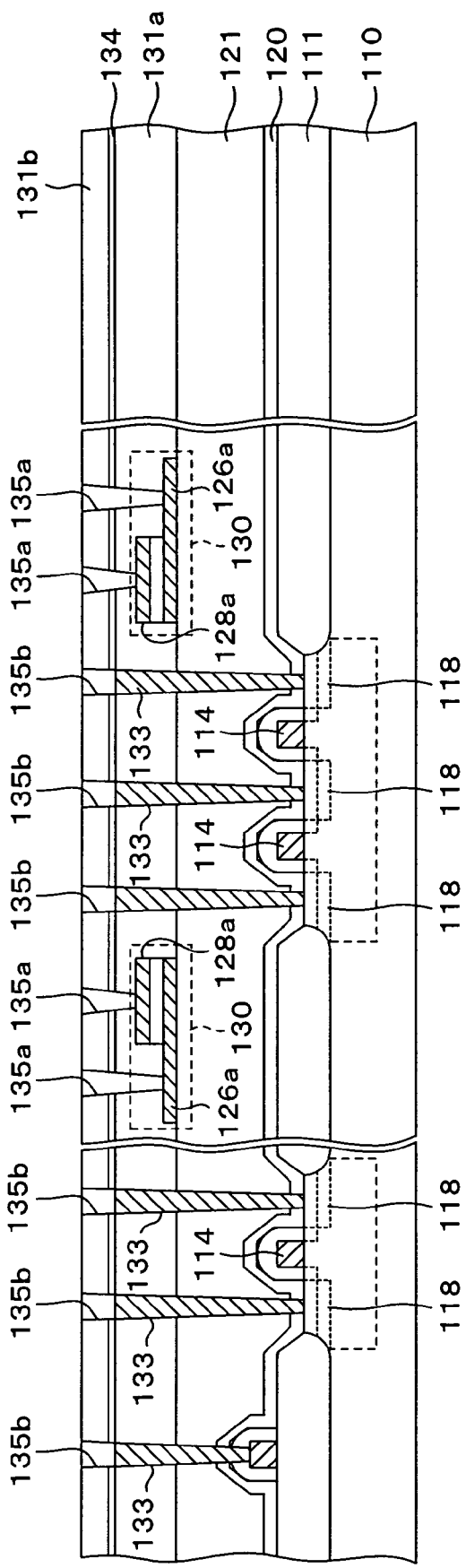

Subsequently, a photoresist film (not illustrated) is formed on the interlayer dielectric 131b once again. Thereafter, the photoresist film is exposed to light, and is developed. Thus, opening portions through which to expose the interlayer dielectric 131b to the outside are formed in predetermined positions. Thereafter, the resultant semiconductor substrate 110 is etched by using the photoresist film as a mask. Thus, contact holes 135b are formed as shown in FIG. 2H. The contact holes 135b extend from the upper surface of the interlayer dielectric 131b, and reach the respective W plugs 133. After the contact holes 135b are formed, the photoresist film is removed.

Figure 2I:
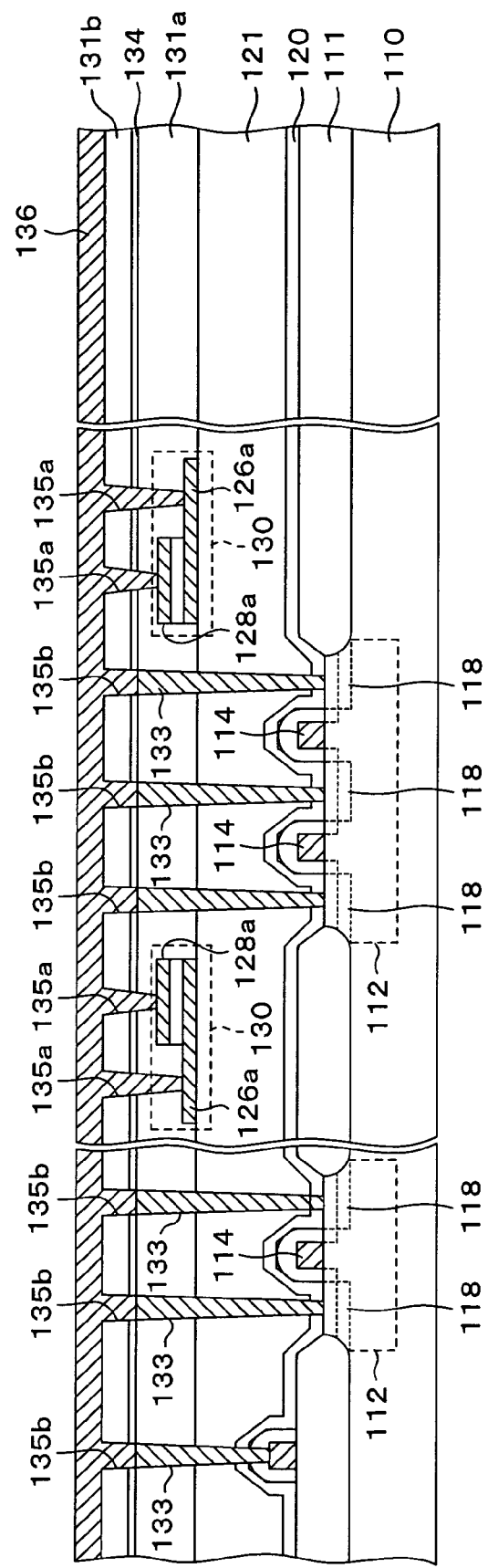

Thereafter, TiN with a thickness of 150 nm, Al—Cu alloy with a thickness of 550 nm, Ti with a thickness of 5 nm, and TiN with a thickness of 150 nm are sequentially deposited on the entire upper surface of the resultant semiconductor substrate 110. Thereby, an aluminum film 136 is formed as shown in FIG. 2I, and concurrently aluminum is filled in the contact holes 135a and the contact holes 135b.

Subsequently, the aluminum film 136 is patterned by use of the photolithographic method and the etching method. Thereby, interconnections 137 in a first interconnection layer are formed as shown in FIG. 2J. In this example, the upper electrode 128a of each of the ferroelectric capacitors 130 is connected to each corresponding one of the transistors (high-concentration impurity regions 118) through each corresponding one of the interconnections 137 and each corresponding one of the tungsten plugs 133. After the interconnections 137 in the first interconnection layer are formed, a thermal process is carried out with the following conditions. For example, a feed rate of nitrogen is 20 liters per minute, the temperature is 350° C., and the process time is 30 minutes.

Figure 2K:
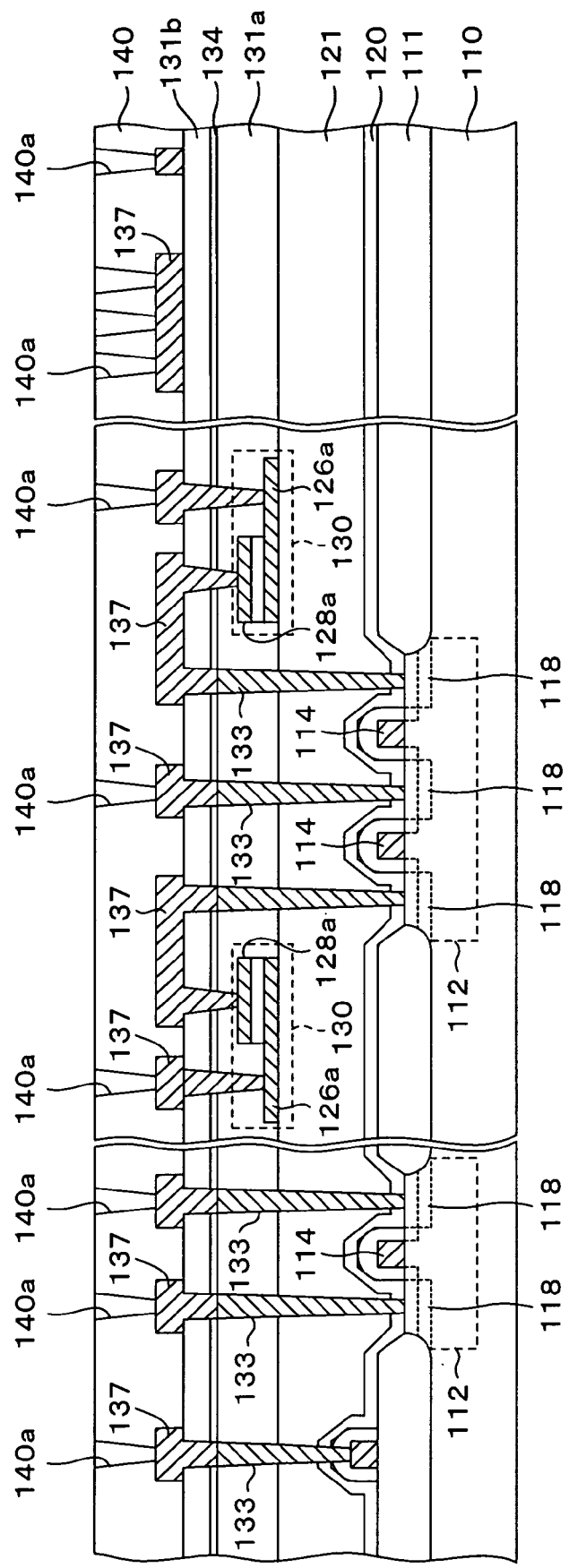

Descriptions will be provided next for steps of and before forming a structure shown in FIG. 2K. After the step of forming the interconnections 137 in the first interconnection layer, an interlayer dielectric 140 to cover the interconnections 137 in the first interconnection layer is formed by depositing TEOS-NSG with a thickness of approximately 2600 nm on the interconnections 137, for example, by use of the plasma CVD method. Thereafter, the upper layer of the interlayer dielectric 140 is planarized by polishing the upper surface by use of the CMP method. Subsequently, contact holes 140a are formed by use of the photolithographic method and the etching method. The contact holes 140a extend from the upper surface of the interlayer dielectric 140, and respectively reach the interconnections 137 in the first interconnection layer.

Figure 2L:
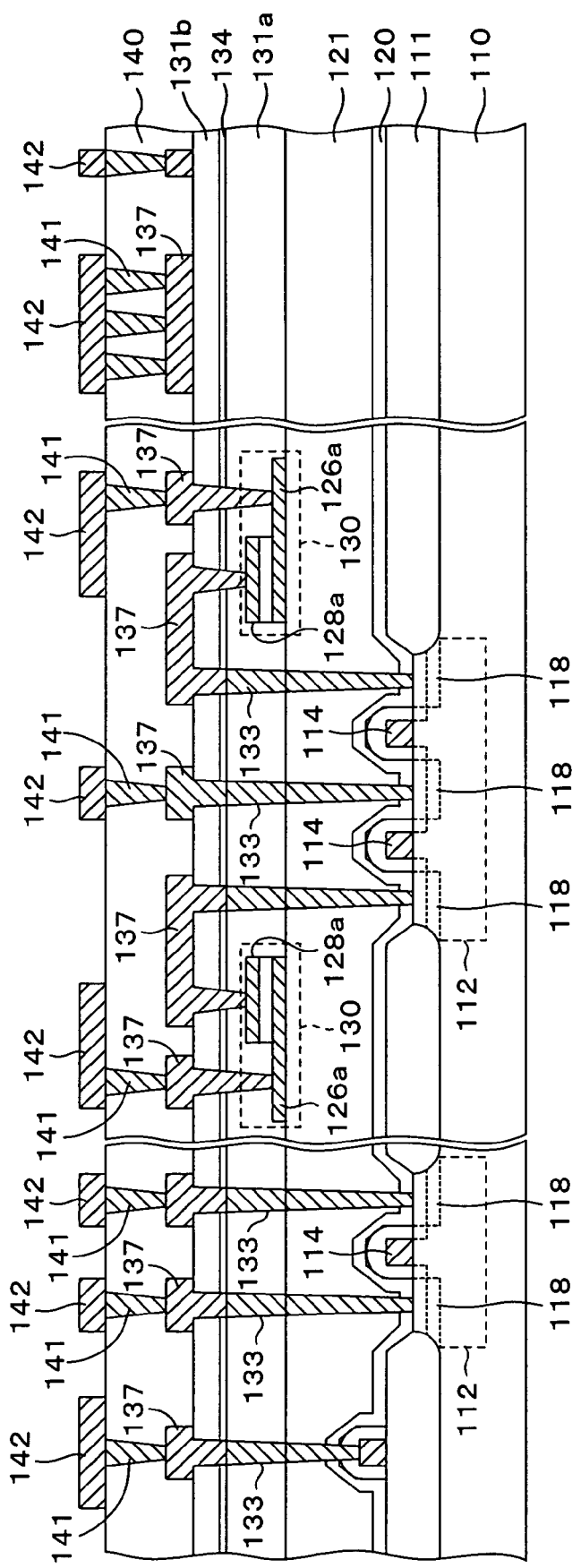

Descriptions will be provided next for steps of and before forming a structure shown in FIG. 2L. After the step of forming the contact holes 140a in the interlayer dielectric 140, a Ti film (not illustrated) with a thickness of 20 nm and a TiN film (not illustrated) with a thickness of 50 nm are sequentially formed on the entire upper surface of the resultant semiconductor substrate 110. Thereafter, a W film is formed on the interlayer dielectric 140 by depositing W on the entire upper surface of the resultant semiconductor substrate 110, and concurrently W is filled in the contact holes 140a. Subsequently, the W film, the TiN film and the Ti film on the interlayer dielectric 140 are removed. Thereby, W (tungsten) plugs 141 are formed in the respective contact holes 140a.

After that, an aluminum film is formed on the entire upper surface of the resultant semiconductor substrate 110 by use of the same method as the interconnections in the first interconnection layer are formed. Subsequently, the aluminum film is patterned, and thus interconnections 142 in a second interconnection layer are formed.

Figure 2M:
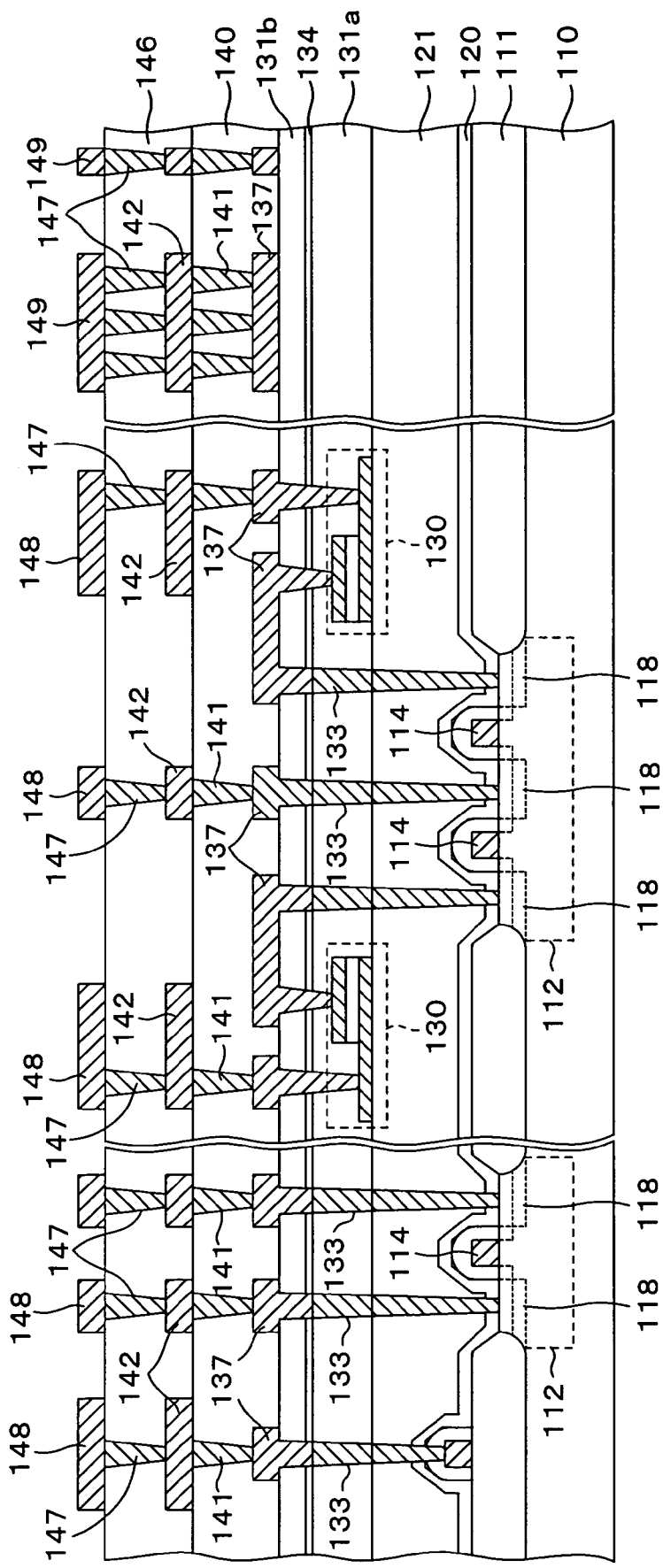

Descriptions will be provided next for steps of and before forming a structure shown in FIG. 2M. After the step of forming the interconnections 142 in the second interconnection layer, an interlayer dielectric 146 is formed by depositing TEOS-NSG with a thickness of approximately 2200 nm on the interconnections 142, for example, by use of the plasma CVD method. The interlayer dielectric 146 covers the interconnections 142 in the second interconnection layer. Thereafter, the upper surface of the interlayer dielectric 146 is planarized by polishing the upper surface by use of the CMP method. Subsequently, contact holes are formed by use of the photolithographic method and the etching method. The contact holes extend from the upper surface of the interlayer dielectric 146, and reach the respective interconnections 142 in the second interconnection layer. Then, W is embedded in these contact holes, and thus W plugs are formed. After that, an aluminum film is formed on the entire upper surface of the resultant semiconductor substrate 110. Subsequently, this aluminum film is patterned. Thus, interconnections 148 in a third interconnection layer and terminals 149 are formed.

Figure 2N:
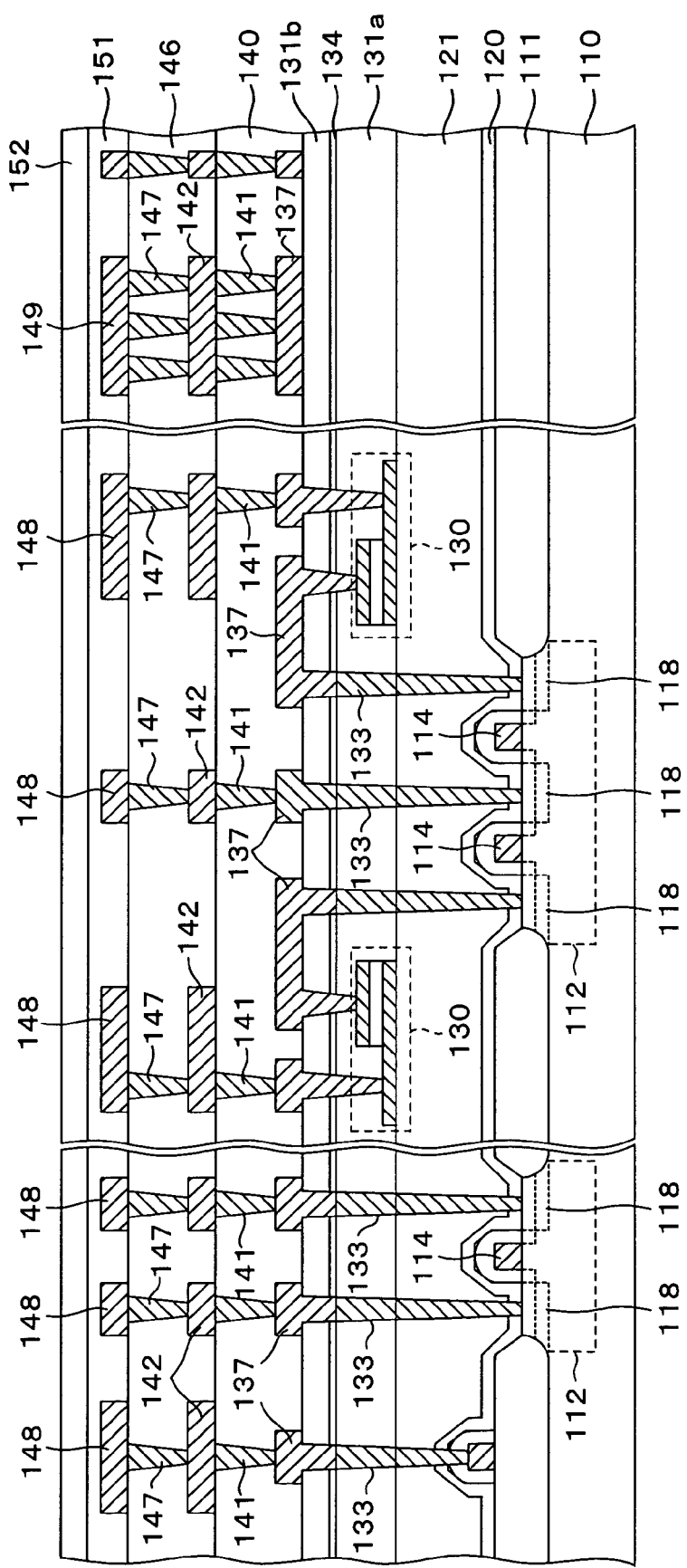

Descriptions will be provided next for steps of and before forming a structure shown in FIG. 2N. After the step of forming the interconnections 148 in the third interconnection layer and the terminals 149, a first passivation film 151 is formed by depositing TEOS-NSG with a thickness of approximately 100 nm on the entire upper surface of the resultant semiconductor substrate 110, for example, by use of the plasma CVD method. The first passivation film 151 covers the interconnections 148 and the terminals 149. Subsequently, a plasma annealing process is applied to this first passivation film 151 at a nitrogen atmosphere. For this annealing process, the temperature is, for example, 350° C., and the process time is, for example, 2 minutes.

Thereafter, a second passivation film 152 is formed on the first passivation film 151 by depositing SiN with a thickness of 350 nm on the first passivation film 151, for example, by use of the plasma CVD method.

Descriptions will be provided next for steps of and before forming a structure shown in FIG. 2O. After the step of forming the first and the second passivation films 151 and 152, by use of the photolithographic method and the etching method, the first and the second passivation films 151 and 152 on the terminals 149 are removed. Thereafter, photosensitive polyimide with a thickness of approximately 3 nm is applied as a protection film 153 to the entire upper surface of the resultant semiconductor substrate 110. Subsequently, an opening portion 153a through which to expose the terminals 149 to the outside is formed in the protection film 153 by exposure and development processes. After that, the polyimide constituting the protection film 153 is hardened, through a heating process, for example, at a temperature of 310° C. in a nitrogen atmosphere for 40 minutes. In the foregoing manner, the semiconductor device (FeRAM) according to the present embodiment is completed. Incidentally, the protection film 153 may be formed of non-photosensitive polyimide.

In the case of the present embodiment, as shown in FIGS. 2A to 2G, the W plugs 133 are formed after the ferroelectric films 127 are annealed. A convention practice is that, after W plugs to be connected to impurity regions (sources/drains) in the surface of a semiconductor substrate are formed, a ferroelectric film is formed, and is thus annealed. In this case, the following two steps need to be performed for the purpose of preventing the W plugs from being oxidized due to the temperature used for annealing the ferroelectric film. One is a step of covering the W plugs with an insulating film made of SiN or the like before annealing. The other is a step of removing the insulating film on each of the W plugs after the annealing. This brings about a cause of increasing manufacturing steps in number.

In contrast, in the case of the present embodiment, the annealing of the ferroelectric films 127 is completed when the W plugs 133 are going to be formed. This makes unnecessary the step of forming the insulating film and the step of removing the insulating film. This brings about an effect that the steps of manufacturing the FeRAM is made simpler, and that time needed for manufacturing the FeRAM is shortened.

In addition, in the case of the present embodiment, the upper surface of the interlayer dielectric 131a covering each of the ferroelectric capacitors 130 is planarized, and the hydrogen barrier layer 134 made of aluminum oxide is formed on the planarized upper surface. Aluminum oxide exhibits poor drape. For this reason, it is likely that a gap is caused in a portion including a step so that hydrogen and moisture can not be fully blocked, if the aluminum oxide is formed immediately on each of the ferroelectric capacitors 130. In the case of the present embodiment, however, the hydrogen barrier layer 134 is formed on the planarized surface of the interlayer dielectric 131a, as described above. This prevents occurrence of a gap allowing hydrogen and moisture to enter. This makes it possible to fully block hydrogen and moisture from entering from the outside, and enhance reliability of the FeRAM.

Second Embodiment

Figure 3:
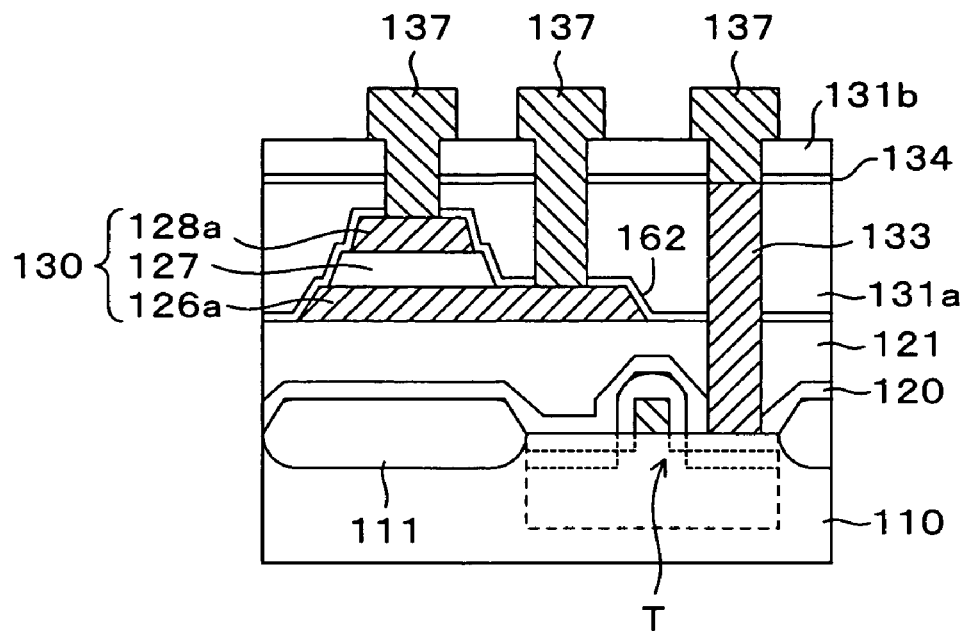
FIG. 3 is a schematic diagram showing a semiconductor device according to a second embodiment of the present invention.

FIG. 3 is a schematic diagram showing a semiconductor device according to a second embodiment of the present invention. The present embodiment is different from the first embodiment in that a hydrogen barrier layer 162 is formed on a ferroelectric capacitor 130 as well. The other components of the present embodiment are basically the same as those of the first embodiment. For this reason, in FIG. 3, the same reference numerals will be used to denote the same or similar components as those in FIG. 1, so that the detailed descriptions will be omitted. Incidentally, in FIG. 3, the illustration of the interconnection structure above the first interconnection layer will be omitted.

In the case of the present embodiment, after the ferroelectric capacitor 130 is formed, the hydrogen barrier layer 162 made of aluminum oxide is formed, for example, with a thickness of 20 nm on the entire upper surface of the resultant semiconductor substrate 110. Thus, the upper side of the ferroelectric capacitor 130 is covered with this hydrogen barrier layer 162. Thereafter, as in the case of the first embodiment, an interlayer dielectric 131a is formed, and the upper surface of the interlayer dielectric 131a is planarized. Subsequently, contact holes are formed. These contact holes extend from the upper surface of the interlayer dielectric 131a, and respectively reach high-concentration impurity regions (source/drain) 118 of each of the transistors T. In this case, the aluminum oxide film (hydrogen barrier layer 162) exists between the upper surface of the interlayer dielectric 131a and each of the high-concentration impurity regions 118 in the surface of the resultant semiconductor substrate 110. Because the number of aluminum oxide films is only one, it is possible to relatively easily form the contact holes. A W plug 133 is formed by embedding W in these contact holes.

Subsequently, as in the case of the first embodiment, a hydrogen barrier layer 134 and an interlayer dielectric 131b are formed on the interlayer dielectric 131a and the W plug 133. Thereafter, contact holes which respectively reach the upper electrode 128a and the lower electrode 126a of the ferroelectric capacitor 130 as well as the W plug 133 are formed. After that, conductors (interconnection materials) are embedded respectively in these contact holes, and concurrently an aluminum film is formed on the interlayer dielectric 131b and the W plug 133. Thereafter, the aluminum film is patterned, and thus interconnections 137 in a second interconnection layer are formed.

The semiconductor device of the present embodiment brings about the same effect as that of the first embodiment. In addition, the semiconductor device of the present embodiment brings about an effect of preventing degeneration of properties of the ferroelectric capacitor 130 more securely than the semiconductor device of the first embodiment. This is because the hydrogen barrier layer 162 made of aluminum oxide is formed on the ferroelectric capacitor 130.

Third Embodiment

Figure 4:
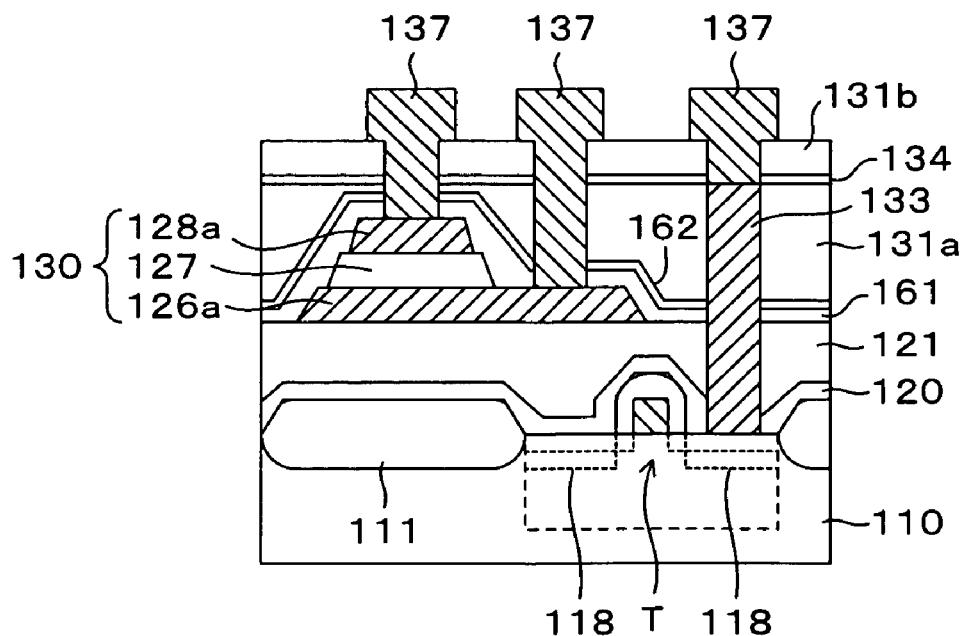
FIG. 4 is a schematic diagram showing a semiconductor device according to a third embodiment of the present invention.

FIG. 4 is a schematic diagram showing a semiconductor device according to a third embodiment of the present invention. The present embodiment is different from the first embodiment in that an insulating film 161 and a hydrogen barrier layer 162 are formed on a ferroelectric capacitor 130. The other components of the present embodiment are basically the same as those of the first embodiment. For this reason, in FIG. 4, the same reference numerals will be used to denote the same or similar components as those in FIG. 1, so that the detailed descriptions will be omitted. Incidentally, in FIG. 4, the illustration of the interconnection structure above the first interconnection layer will be omitted as well.

In the case of the present embodiment, after the ferroelectric capacitor 130 is formed, the insulating film 161 is formed, for example, with a thickness of 50 nm to 100 nm on the entire upper surface of the resultant semiconductor substrate 110. It is desirable that this insulating film 161 be formed of an insulator, such as $SiO_2$, which exhibits better drape. Thereafter, the hydrogen barrier layer 162 made of aluminum oxide is formed, for example, with a thickness of 20 nm on the insulating film 161.

Subsequently, as in the case of the first embodiment, an interlayer dielectric 131a is formed, and the upper surface of the interlayer dielectric 131a is planarized. Thereafter, contact holes are formed. These contact holes extend from the upper surface of the interlayer dielectric 131a, and respectively reach the high-concentration impurity regions (source/drain) 118 of the transistors T. W is embedded in these contact holes, and thus W plugs 133 are formed.

Thereafter, as in the case of the first embodiment, a hydrogen barrier layer 134 and an interlayer dielectric 131b are formed. Subsequently, contact holes are formed. These contact holes extend from the upper surface of the interlayer dielectric 131b, and respectively reach the upper electrode 128a and the lower electrode 126a of the ferroelectric capacitor 130 as well as the W plug 133. After that, conductors (interconnection materials) are embedded respectively in these contact holes. Concurrently, an aluminum film is formed on the interlayer dielectric 131b and the W plug 133. Thereafter, the aluminum film is patterned. Thus, interconnections 137 in a second interconnection layer are formed.

In the case of the second embodiment shown in FIG. 3, the hydrogen barrier layer 162 is formed directly on the ferroelectric capacitor 130. In this case, it is likely that a gap allowing hydrogen and moisture to enter there may be caused in a portion including a step in the hydrogen barrier layer 162. One may consider that an effect of sufficiently blocking hydrogen and moisture can not be obtained. By contrast, in the case of the present embodiment, the insulating film 161 is formed on the ferroelectric capacitor 130, and the hydrogen barrier layer 162 is formed on the insulating film 161. This makes a step in the hydrogen barrier layer 162 smaller, and accordingly prevents occurrence of a gap allowing hydrogen and moisture to enter there.

Fourth Embodiment

Figure 5:
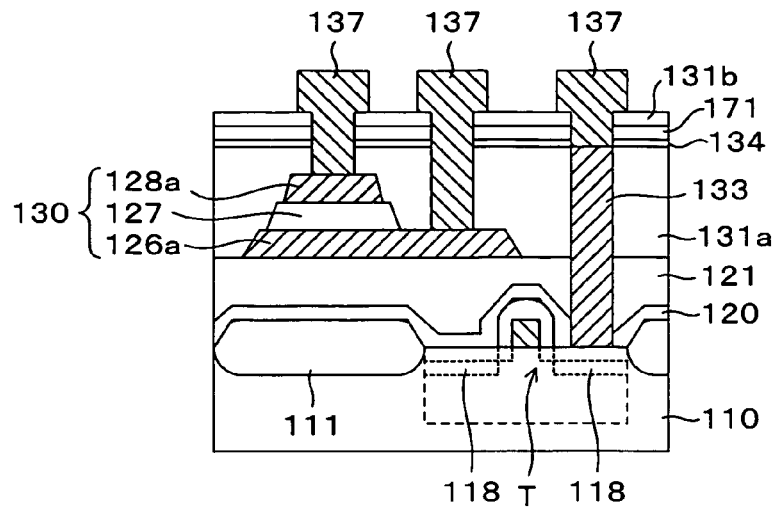
FIG. 5 is a schematic diagram showing a semiconductor device according to a fourth embodiment of the present invention.

FIG. 5 is a schematic diagram showing a semiconductor device according to a fourth embodiment of the present invention. The present embodiment is different from the first embodiment in that a moisture barrier layer 171 for preventing moisture from entering a portion under the layer 171 is formed on a hydrogen barrier layer 134. The other components of the present embodiment are basically the same as those of the first embodiment. For this reason, in FIG. 5, the same reference numerals will be used to denote the same or similar components as those in FIG. 1, so that the detailed descriptions will be omitted. Incidentally, in FIG. 5, the illustration of the interconnection structure above the first interconnection layer will be omitted.

In the case of the present embodiment, after an interlayer dielectric 131a and a W plug 133 are formed, the hydrogen barrier layer 134, the moisture barrier layer 171 and an interlayer dielectric 131b are formed in this order. It is necessary that the moisture barrier layer 171 should fully prevent moisture from entering a portion under the moisture barrier layer 171. In the case of the present embodiment, a SiN film or a SiON film is formed with a thickness of 50 nm to 100 nm as the moisture barrier layer 171.

In the case of the prevent embodiment, the moisture barrier layer 171 is formed in addition to the hydrogen barrier layer 134. This enables the semiconductor device of the present embodiment to prevent hydrogen and moisture from entering the ferroelectric films 127 more securely than the semiconductor device of the first embodiment.

Moreover, stress which the aluminum oxide film (hydrogen barrier layer 134) imposes on the ferroelectric films 127 is eased by the film made of SiN or SiON (moisture barrier layer 171). This enables the semiconductor device of the present embodiment to enhance the properties of the ferroelectric capacitor 130 in comparison with the semiconductor device of the first embodiment.

Fifth Embodiment

Figure 6:
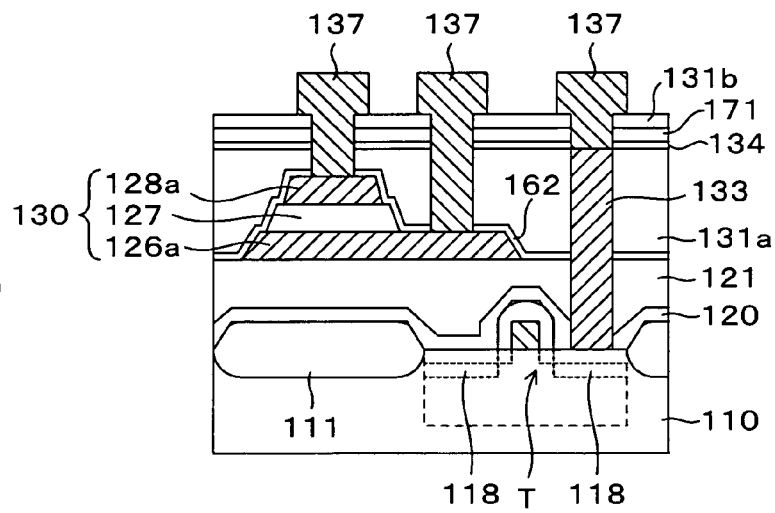
FIG. 6 is a schematic diagram showing a semiconductor device according to a fifth embodiment of the present invention.

FIG. 6 is a schematic diagram showing a semiconductor device according to a fifth embodiment of the present invention. The present embodiment is different from the fourth embodiment in that a hydrogen barrier layer 162 is formed on a ferroelectric capacitor 130 as well. The other components of the present embodiment are basically the same as those of the fourth embodiment. For this reason, in FIG. 6, the same reference numerals will be used to denote the same or similar components as those in FIG. 5, so that the detailed descriptions will be omitted.

In the case of the present embodiment, after the ferroelectric capacitor 130 is formed, the hydrogen barrier layer 162 made of aluminum oxide is formed, for example, with a thickness of 20 nm on the entire upper surface of the resultant semiconductor substrate 110. Thus, the upper side of the ferroelectric capacitor 130 is covered with this hydrogen barrier layer 162. Thereafter, an interlayer dielectric 131a and a W plug 133 are formed. Subsequently, a hydrogen barrier layer 134, a moisture barrier layer 171 and an interlayer dielectric 131b are formed in this order. After that, contact holes are formed. These contact holes respectively reach the upper electrode 128a and the lower electrode 126a of the ferroelectric capacitor 130 as well as the plug 133. Subsequently, conductors (interconnection materials) are embedded in these contact holes, and an aluminum film is formed on the interlayer dielectric 131b and the plug 133. Thereafter, the aluminum film is patterned, and thus interconnections 137 in a second interconnection layer are formed.

The semiconductor device of the present embodiment brings about the same effect as the semiconductor device of the fourth embodiment. In addition, the semiconductor device of the present invention can prevent degeneration of the properties of the ferroelectric capacitor 130 more securely than the semiconductor device of the fourth embodiment. This is because the hydrogen barrier layer 162 made of aluminum oxide is formed on the ferroelectric capacitor 130 as well.

6th Embodiment

Figure 7:
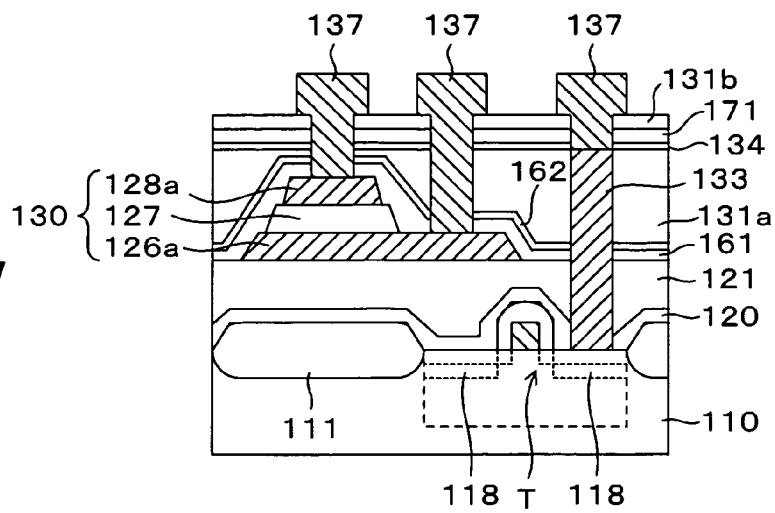
FIG. 7 is a schematic diagram showing a semiconductor device according to a 6th embodiment of the present invention.

FIG. 7 is a schematic diagram showing a semiconductor device according to a 6th embodiment of the present invention. The present embodiment is different from the fourth embodiment in that an insulating film 161 and a hydrogen barrier layer 162 are formed on a ferroelectric capacitor 130. The other components of the present embodiment are basically the same as those of the fourth embodiment. For this reason, in FIG. 7, the same reference numerals will be used to denote the same or similar components as those in FIG. 5, so that the detailed descriptions will be omitted.

In the case of the present embodiment, after the ferroelectric capacitor 130 is formed, the insulating film 161 made of an insulator, such as SiO$_2$, which exhibit better drape is formed, for example, with a thickness of 50 nm to 100 nm on the entire upper surface of the resultant semiconductor substrate 110. Thereafter, the hydrogen barrier layer 162 made of aluminum oxide is formed, for example, with a thickness of 20 nm on the insulating film 161.

Subsequently, as in the case of the fourth embodiment, an interlayer dielectric 131a and a W plug 133 are formed. Thereafter, an hydrogen barrier layer 134, a moisture barrier layer 171 and an interlayer dielectric 131b are formed on the interlayer dielectric 131a and the W plugs 133.

The present embodiment brings about the same effect as the fourth embodiment. In addition, the present embodiment makes a step in the hydrogen barrier layer 162 smaller, and accordingly further enhances the barrier properties of the hydrogen barrier layer 162 against hydrogen and moisture. This is because the insulating film 161 is formed between the ferroelectric capacitor 130 and the hydrogen barrier layer 162.

In each of the fourth to the 6th embodiments (refer to FIGS. 5 to 7), the hydrogen barrier layer 134 is formed on the interlayer dielectric 131a, and the moisture barrier layer 171 is formed on the hydrogen barrier layer 134. However, it also serves the purpose that the moisture barrier layer 171 is formed on the interlayer dielectric 131a, and that the hydrogen barrier layer 134 is thereafter formed on the moisture barrier layer 171.

7th Embodiment

Figure 8:
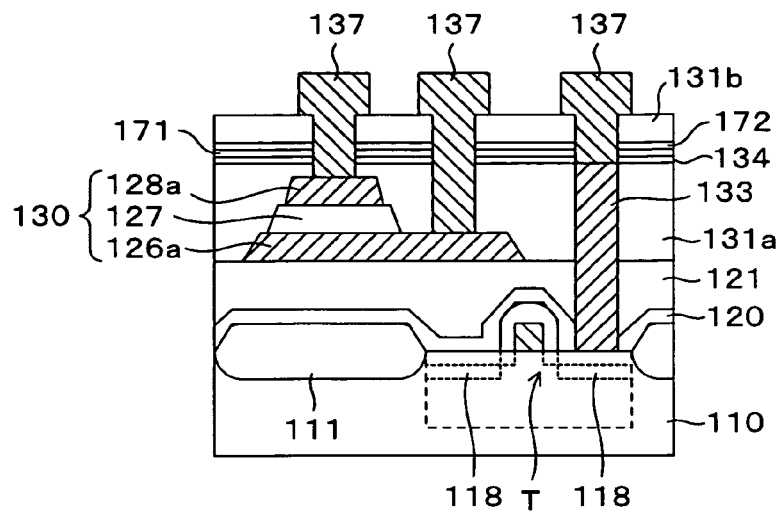
FIG. 8 is a schematic diagram showing a semiconductor device according to a 7th embodiment of the present invention.

FIG. 8 is a schematic diagram showing a semiconductor device according to a 7th embodiment of the present invention. The present embodiment is different from the first embodiment in that a moisture barrier layer 171 and a hydrogen barrier layer 172 for preventing moisture and hydrogen from entering a portion under the layer 171 are formed on the hydrogen barrier layer 134. The other components of the present embodiment are basically the same as those of the first embodiment. For this reason, in FIG. 8, the same reference numerals will be used to denote the same or similar components as those in FIG. 1, so that the detailed descriptions will be omitted. Incidentally, in FIG. 8, the illustration of the interconnection structure above the first interconnection layer will be omitted.

In the case of the present embodiment, after an interlayer dielectric 131a and a W plug 133 are formed, the hydrogen barrier layer 134, the moisture barrier layer 171, the hydrogen barrier layer 172 and an interlayer dielectric 131b are formed in this order on the interlayer dielectric 131a and the W plug 133. The moisture barrier layer 171 is formed, for example, of SiN or SiON with a thickness of 50 nm. The hydrogen barrier layer 172 is formed, for example, of aluminum oxide with a thickness of approximately 20 nm.

In the case of the present embodiment, the moisture barrier layer 171 and the hydrogen barrier layer 172 are formed in addition to the hydrogen barrier layer 134. This enables the present embodiment to prevent hydrogen and moisture from entering the ferroelectric film 127 more securely than the first embodiment.

8th Embodiment

Figure 9:
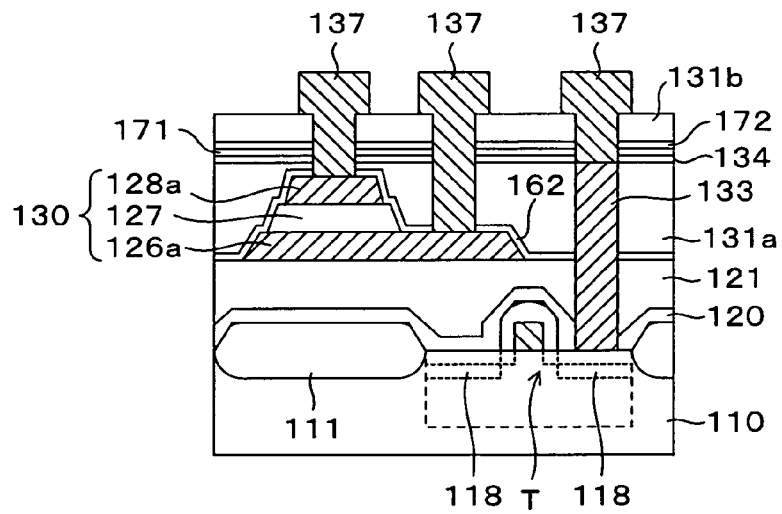
FIG. 9 is a schematic diagram showing a semiconductor device according to an 8th embodiment of the present invention.

FIG. 9 is a schematic diagram showing a semiconductor device according to an 8th embodiment of the present invention. The present embodiment is different from the 7th embodiment in that a hydrogen barrier layer 162 is formed on the ferroelectric capacitor 130 as well. The other components of the present embodiment are basically the same as those of the 7th embodiment. For this reason, in FIG. 9, the same reference numerals will be used to denote the same or similar components as those in FIG. 8, so that the detailed descriptions will be omitted.

In the case of the present embodiment, after the ferroelectric capacitor 130 is formed, a hydrogen barrier layer 162 made of aluminum oxide is formed, for example, with a thickness of 20 nm on the entire upper surface of the resultant semiconductor substrate 110. Thereafter, an interlayer dielectric 131a and a W plug 133 are formed. Subsequently, a hydrogen barrier layer 134, a moisture barrier layer 171 and a hydrogen barrier layer 172 and an interlayer dielectric 131b are formed sequentially on the interlayer dielectric 131a and the W plug 133. After that, contact holes are formed. These contact holes respectively reach the upper electrode 128a and the lower electrode 126a of the ferroelectric capacitor 130 as well as the plug 133. Subsequently, aluminum is embedded in these contact holes, and concurrently an aluminum film is formed on the interlayer dielectric 131b and the plug 133. Thereafter, the aluminum film is patterned, and thus interconnections 137 in a second layer are formed.

The present embodiment brings about the same effect as the 7th embodiment. In addition, the present embodiment makes it possible to prevent degeneration of the properties of the ferroelectric capacitor 130 more securely than the 7th embodiment. This is because the hydrogen barrier layer 162 made of aluminum oxide is formed on the ferroelectric capacitor 130 as well.

9th Embodiment

Figure 10:
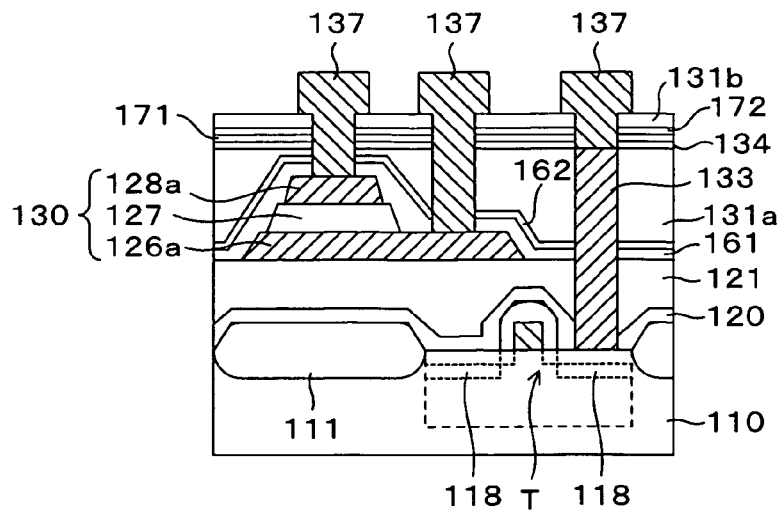
FIG. 10 is a schematic diagram showing a semiconductor device according to a 9th embodiment of the present invention.

FIG. 10 is a schematic diagram showing a semiconductor device according to a 9th embodiment of the present invention. The present embodiment is different from the 7th embodiment in that an insulating film 161 and a hydrogen barrier layer 162 are formed on the ferroelectric capacitor 130. The other components of the present embodiment are basically the same as those of the 7th embodiment. For this reason, in FIG. 10, the same reference numerals will be used to denote the same or similar components as those in FIG. 8, so that the detailed descriptions will be omitted.

In the case of the present embodiment, after the ferroelectric capacitor 130 is formed, the insulating film 161 made of an insulator, such as $SiO_2$, which exhibits better drape, is formed, for example, with a thickness of 50 nm to 100 nm on the entire upper surface of the resultant semiconductor substrate 110. Thereafter, the hydrogen barrier layer 162 made of aluminum oxide is formed, for example, with a thickness of 20 nm on the insulating film 161.

Subsequently, as in the case of the 7th embodiment, an interlayer dielectric 131a and a W plug 133 are formed. After that, a hydrogen barrier layer 134, a moisture barrier layer 171, a hydrogen barrier layer 172 and an interlayer dielectric 131b are formed on the interlayer dielectric 131a and the W plug 133.

The present embodiment brings about the same effect as the 7th embodiment. In addition, the formation of the insulating film 161 between the ferroelectric capacitor 130 and the hydrogen barrier layer 162 makes a step in the hydrogen barrier layer 162 smaller. This enhances the barrier properties of the hydrogen barrier layer 162 against hydrogen and moisture.

Descriptions have been provided for each of the 7th to the 9th embodiments (refer to FIGS. 8 to 10) citing the example in which the hydrogen barrier layer 134, the moisture barrier layer 171 and the hydrogen barrier layer 172 are formed in this order on the interlayer dielectric 131a. However, it also serves the purpose that a first moisture barrier layer is formed on the interlayer dielectric 131a, and that the hydrogen barrier layer and a second moisture barrier layer are thereafter formed on the first moisture barrier layer.

10th Embodiment

Figure 11:
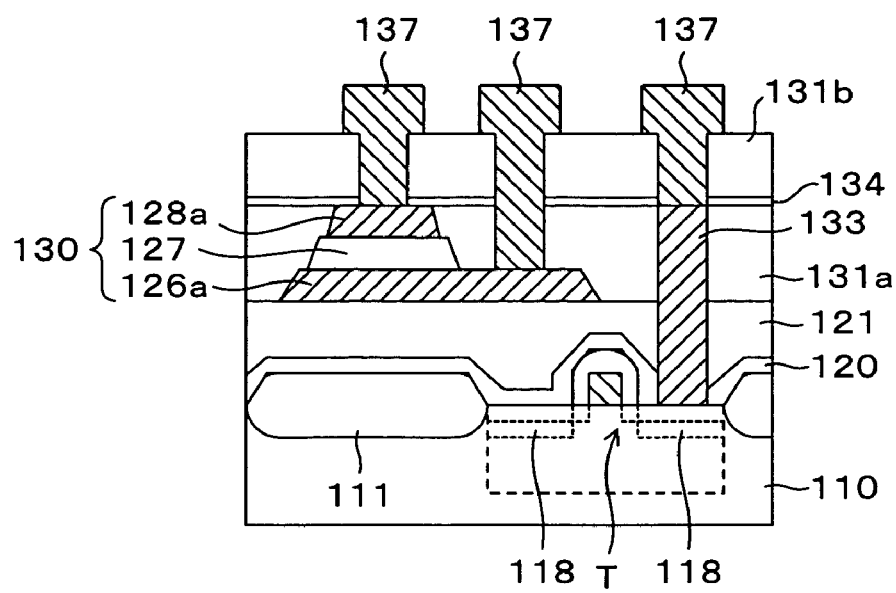
FIG. 11 is a schematic diagram showing a semiconductor device according to a 10th embodiment of the present invention.

FIG. 11 is a schematic diagram showing a semiconductor device according to a 10th embodiment of the present invention. The present embodiment is different from the first embodiment in that the upper surface of a ferroelectric capacitor 130 and the upper surface of an interlayer dielectric 131a are continuous to each other (the upper surface of the ferroelectric capacitor 130 and the upper surface of the interlayer dielectric 131a exist in a single plane). The other components of the present embodiment are basically the same as those of the first embodiment. For this reason, in FIG. 11, the same reference numerals will be used to denote the same or similar components as those in FIG. 1, so that the detailed descriptions will be omitted. Incidentally, in FIG. 11, the illustration of the interconnection structure above the first interconnection layer will be omitted.

In the case of the present embodiment, after the ferroelectric capacitor 130 and the interlayer dielectric 131a are formed, the interlayer dielectric 131a is polished by CMP until the upper electrode 138a of the ferroelectric capacitor 130 is exposed. Subsequently, a W plug 133 is formed. Thereafter, a hydrogen barrier layer 134 is formed on the entire upper surface of the resultant semiconductor substrate 110.

As described above, the properties of the ferroelectric film 127 of the ferroelectric capacitor 130 are prone to degenerate due to moisture and hydrogen included in the interlayer dielectric. In the case of the present embodiment, the interlayer dielectric 131a is formed with as a thinner thickness as possible. This enables the present embodiment to prevent degeneration of the properties of the ferroelectric capacitor 130 more securely than the first embodiment. In addition, the arrangement of the planarized aluminum oxide film (hydrogen barrier layer 134) near the ferroelectric capacitor 130 brings about an advantage of enhancement of HTS (High Temperature Storage) properties in the case of the present embodiment.

11th Embodiment

Figure 12:
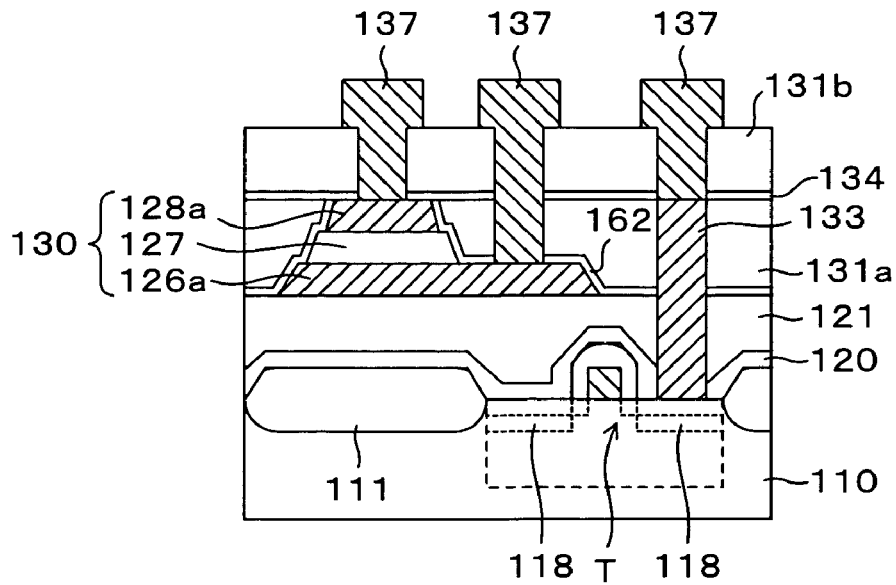
FIG. 12 is a schematic diagram showing a semiconductor device according to an 11th embodiment of the present invention.

FIG. 12 is a schematic diagram showing a semiconductor device according to an 11th embodiment of the present invention. The present embodiment is different from the 10th embodiment in that a hydrogen barrier layer 162 is formed on a ferroelectric capacitor 130 as well. The other components of the present embodiment are basically the same as those of the 10th embodiment. For this reason, in FIG. 12, the same reference numerals will be used to denote the same or similar components as those in FIG. 11, so that the detailed descriptions will be omitted.

In the case of the present embodiment, after the ferroelectric capacitor 130 is formed, the hydrogen barrier layer 162 made of aluminum oxide is formed, for example, with a thickness of 20 nm on the entire upper surface of the resultant semiconductor substrate 110. Thereafter, as in the case of the 10th embodiment, after an interlayer dielectric 131a is formed, the interlayer dielectric 131a is polished by CMP until the upper electrode 128a of the ferroelectric capacitor 130 is exposed. Subsequently, W plug 133 is formed. Thereafter, a hydrogen barrier layer 134 and an interlayer dielectric 131b are formed on the entire upper surface of the resultant semiconductor 110.

In the case of the present embodiment, the hydrogen barrier layer 162 made of aluminum oxide is formed on the ferroelectric capacitor 130 as well. This brings about an effect of enabling the 11th embodiment to prevent degeneration of the properties of the ferroelectric capacitor 130 more securely than the 10th embodiment.

12th Embodiment

Figure 13:
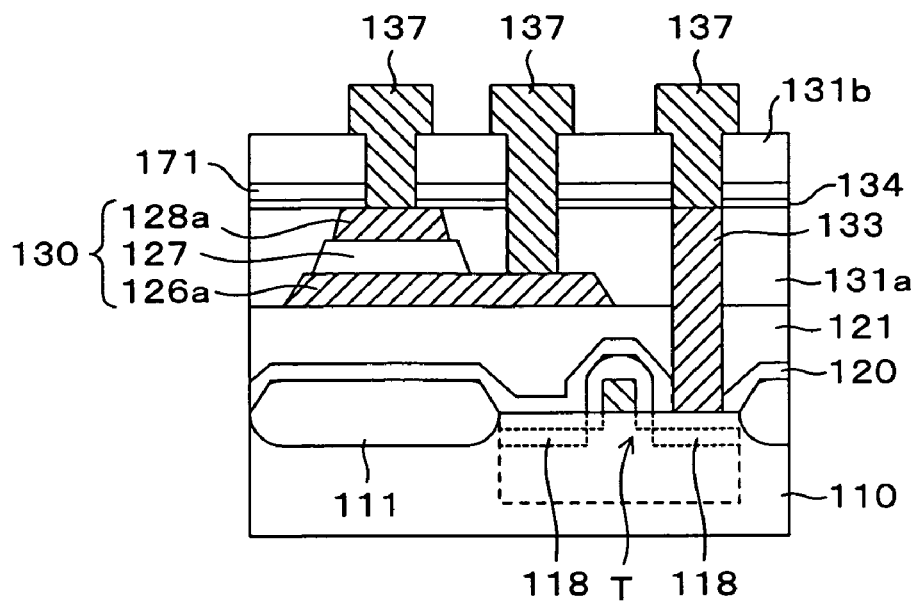
FIG. 13 is a schematic diagram showing a semiconductor device according to a 12th embodiment of the present invention.

FIG. 13 is a schematic diagram showing a semiconductor device according to a 12th embodiment of the present invention. The present embodiment is different from the 10th embodiment in that a moisture barrier layer 171 for preventing moisture from entering a portion under the layer 171 is formed on a hydrogen barrier layer 134. The other components of the present embodiment are basically the same as those of the 10th embodiment. For this reason, in FIG. 13, the same reference numerals will be used to denote the same or similar components as those in FIG. 11, so that the detailed descriptions will be omitted.

In the case of the present embodiment, after an interlayer dielectric 131a is formed, the interlayer dielectric 131a is polished by CMP until the upper electrode 128a of the ferroelectric capacitor 130 is exposed. Thereafter, W plugs 133 are formed. Subsequently, a hydrogen barrier layer 134 and a moisture barrier layer 171 are formed on the entire upper surface of the resultant semiconductor substrate 110. The moisture barrier layer 171 is formed, for example, of SiN or SiON with a thickness of 50 nm to 100 nm.

In the case of the present embodiment, the moisture barrier layer 171 is formed in addition to the hydrogen barrier layer 134. This enables the present embodiment to prevent moisture from entering the ferroelectric films 127 more securely than the 10th embodiment.

13th Embodiment

Figure 14:
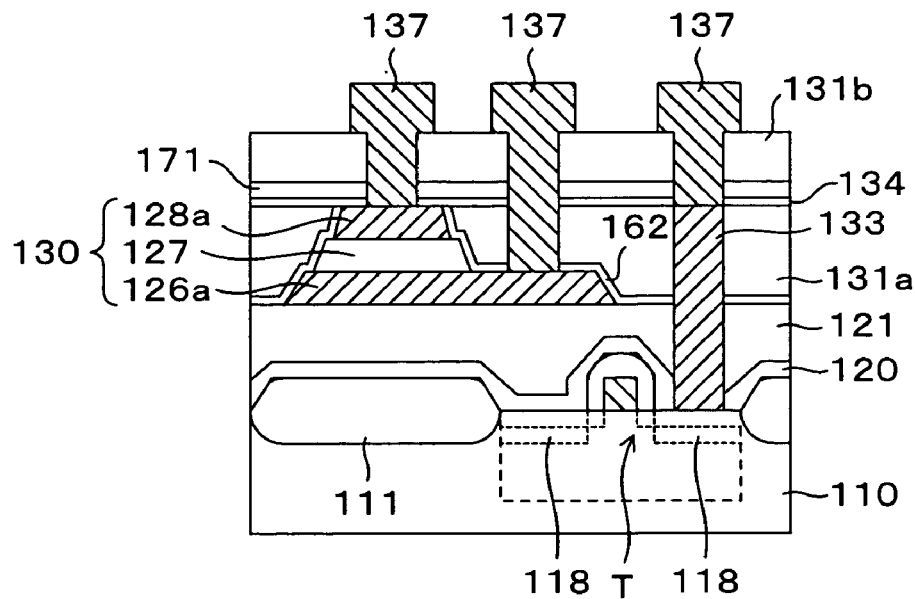
FIG. 14 is a schematic diagram showing a semiconductor device according to a 13th embodiment of the present invention.

FIG. 14 is a schematic diagram showing a semiconductor device according to a 13th embodiment of the present invention. The present embodiment is different from the 12th embodiment in that a hydrogen barrier layer 162 is formed on a ferroelectric capacitor 130 as well. The other components of the present embodiment are basically the same as those of the 12th embodiment. For this reason, in FIG. 14, the same reference numerals will be used to denote the same or similar components as those in FIG. 13, so that the detailed descriptions will be omitted.

In the case of the present embodiment, after the ferroelectric capacitor 130 is formed, the hydrogen barrier layer 162 made of aluminum oxide is formed, for example, with a thickness of 20 nm on the entire upper surface of the resultant semiconductor substrate 110. Thereafter, an interlayer dielectric 131a is formed. Subsequently, the interlayer dielectric 131a is polished by CMP until the upper electrode 128a of the ferroelectric capacitor 130 is exposed. After that, a W plug 133 is formed. Thereafter, a hydrogen barrier layer 134, a moisture barrier layer 171 and an interlayer dielectric 131b are formed on the entire upper surface of the resultant semiconductor substrate 110.

The present embodiment can bring about the same effect as the 12th embodiment. In addition, the present embodiment can prevent degeneration of the ferroelectric capacitor 130 more securely than the 12th embodiment. This is because the hydrogen barrier layer 162 is formed on the ferroelectric capacitor 130 as well.

In each of the 12th and 13th embodiments (refer to FIGS. 13 and 14), the hydrogen barrier layer 134 is formed on the interlayer dielectric 131a, and the moisture barrier layer 171 is formed on the hydrogen barrier layer 134. However, it also serves the purpose that the moisture barrier layer 171 is formed on the interlayer dielectric 131a, and that the hydrogen barrier layer 134 is thereafter formed on the moisture barrier layer 171.

14th Embodiment

Figure 15:
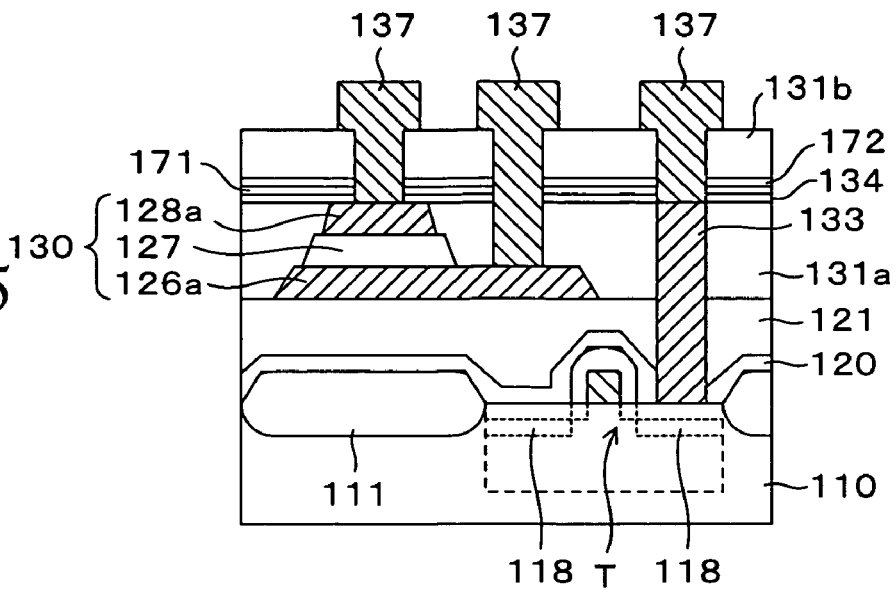
FIG. 15 is a schematic diagram showing a semiconductor device according to a 14th embodiment of the present invention.

FIG. 15 is a schematic diagram showing a semiconductor device according to a 14th embodiment of the present invention. The present embodiment is different from the 12th embodiment in that a moisture barrier layer 171 and a hydrogen barrier layer 172 are formed on a hydrogen barrier layer 134. The other components of the present embodiment are basically the same as those of the 12th embodiment. For this reason, in FIG. 15, the same reference numerals will be used to denote the same or similar components as those in FIG. 13, so that the detailed descriptions will be omitted.

In the case of the present embodiment, after an interlayer dielectric 131a is formed, the interlayer dielectric 131a is polished by CMP until the upper electrode 128a of a ferroelectric capacitor 130 is exposed. Subsequently, W plugs 133 are formed. Thereafter, the hydrogen barrier layer 134, the moisture barrier layer 171, the hydrogen barrier layer 172 and an interlayer dielectric 131b are formed on the entire upper surface of the resultant semiconductor substrate 110. The moisture barrier layer 171 is formed, for example, of SiN or SiON with a thickness of 50 nm. The hydrogen barrier layer 172 is formed, for example, of aluminum oxide with a thickness of approximately 20 nm.

In the case of the present embodiment, the moisture barrier layer 171 and the hydrogen barrier layer 172 are formed in the addition to the hydrogen barrier layer 134. This enables the 14th embodiment to prevent hydrogen and moisture from entering the ferroelectric films 127 more securely than the 12th embodiment.

15th Embodiment

Figure 16:
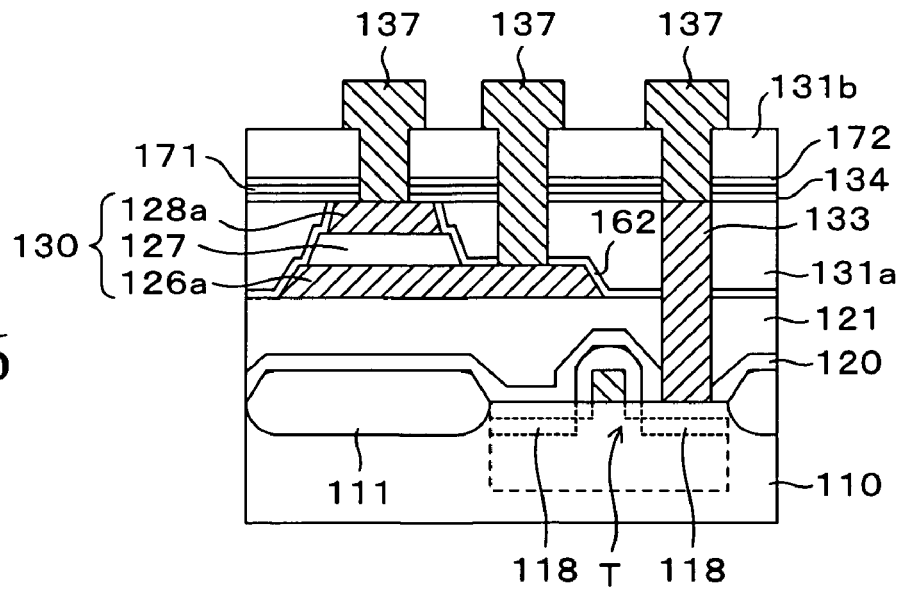
FIG. 16 is a schematic diagram showing a semiconductor device according to a 15th embodiment of the present invention.

FIG. 16 is a schematic diagram showing a semiconductor device according to a 15th embodiment of the present invention. The present embodiment is different from the 14th embodiment in that a hydrogen barrier layer 162 is formed on a ferroelectric capacitor 130. The other components of the present embodiment are basically the same as those of the 14th embodiment. For this reason, in FIG. 16, the same reference numerals will be used to denote the same or similar components as those in FIG. 15, so that the detailed descriptions will be omitted.

In the case of the present embodiment, after the ferroelectric capacitor 130 is formed, the hydrogen barrier layer 162 made of aluminum oxide is formed, for example, with a thickness of 20 nm on the entire upper surface of the resultant semiconductor substrate 110. Thereafter, an interlayer dielectric 131a is formed. Subsequently, the interlayer dielectric 131a is polished by CMP until the upper electrode 128a of the ferroelectric capacitor 130 is exposed. After that, a W plug 133 is formed. Thereafter, an hydrogen barrier layer 134, a moisture barrier layer 171, a hydrogen barrier layer 172 and an interlayer dielectric 131b are formed on the entire upper surface of the resultant semiconductor substrate 110. The moisture barrier layer 171 is formed, for example, of SiN or SiON with a thickness of 50 nm. The hydrogen barrier layer 172 is formed, for example, of aluminum oxide with a thickness of approximately 20 nm.

The present embodiment can bring about the same effect as the 14th embodiment. In addition, the present embodiment makes it possible to prevent degeneration of the properties of the ferroelectric capacitor 130 more securely than the 14th embodiment. This is because the hydrogen barrier layer 162 made of aluminum oxide is formed on the ferroelectric capacitor 130 as well.

Descriptions have been provided for the 14th and the 15th embodiments citing the example in which the hydrogen barrier layer 134, the moisture barrier layer 171 and the hydrogen barrier layer 172 are formed in this order. However, it also serves the purpose that a first moisture barrier layer is formed on the interlayer dielectric 131*a*, and that a hydrogen barrier layer and a second hydrogen barrier layer is thereafter formed on the first moisture barrier layer.

16th Embodiment

Figure 17:
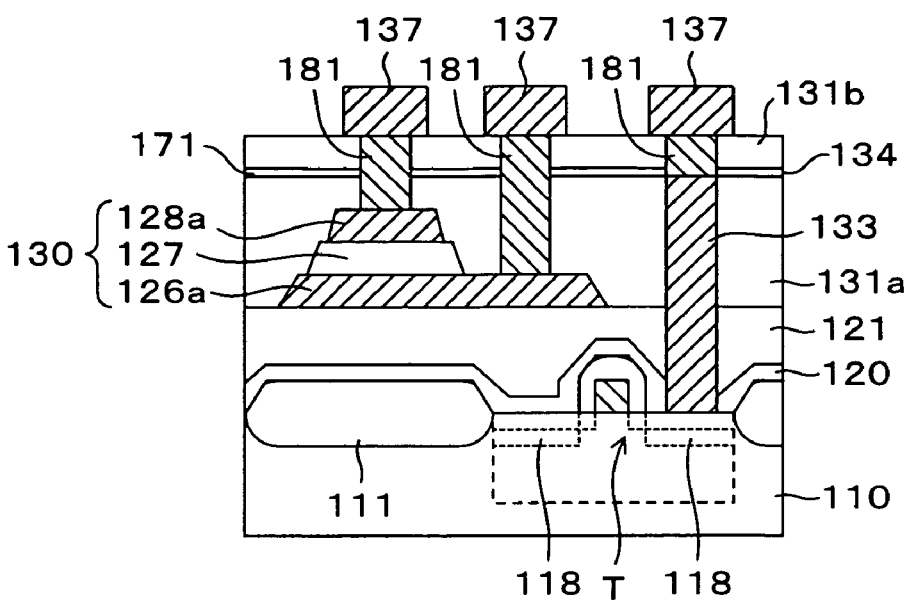
FIG. 17 is a schematic diagram showing a semiconductor device according to a 16th embodiment of the present invention.

FIG. 17 is a schematic diagram showing a semiconductor device according to a 16th embodiment of the present invention. The present embodiment is different from the first embodiment in that interconnections 137 in a first interconnection layer are connected respectively to the upper electrode 128*a* and the lower electrode 126*a* of a ferroelectric capacitor 130 as well as W plug 133 through W plugs 181. The other components of the present embodiment are basically the same as those of the first embodiment. For this reason, in FIG. 17, the same reference numerals will be used to denote the same or similar components as those in FIG. 1, so that the detailed descriptions will be omitted. Incidentally, in FIG. 17, the illustration of the interconnection structure above the first interconnection layer will be omitted.

In the case of the present embodiment, after a hydrogen barrier layer 134 and an interlayer dielectric 131*b* are formed, contact holes are formed. These contact holes extend from the upper surface of the interlayer dielectric 131*b*, and communicate respectively with the upper electrode 128*a*, the lower electrode 126*a* and the W plug 133. Thereafter, a Ti film with a thickness of 20 nm and a TiN film with a thickness of 50 nm (none of the films are illustrated) are sequentially formed on the entire upper surface of the resultant semiconductor substrate 110, for example, by use of the PVD method. Subsequently, W is deposited on the entire upper surface of the resultant semiconductor substrate 110, for example, by use of the CVD method. Thus, a W film is formed on the interlayer dielectric 131*b*, and concurrently W is filled in the contact holes.

Subsequently, the W film, the TiN film and the Ti film on the interlayer dielectric 131*b* are removed by use of the CMP method. In the foregoing manner, W plugs 181 to be connected respectively to the upper electrode 128*a*, the lower electrode 126*a* and the W plugs 133 are formed. Thereafter, an aluminum film is formed on the entire upper surface of the resultant semiconductor substrate 110. After that, the aluminum film is etched, and thus interconnections 137 in a first interconnection layer are formed. The present embodiment can brings about the same effect as the first embodiment as well.

17th Embodiment

Figure 18:
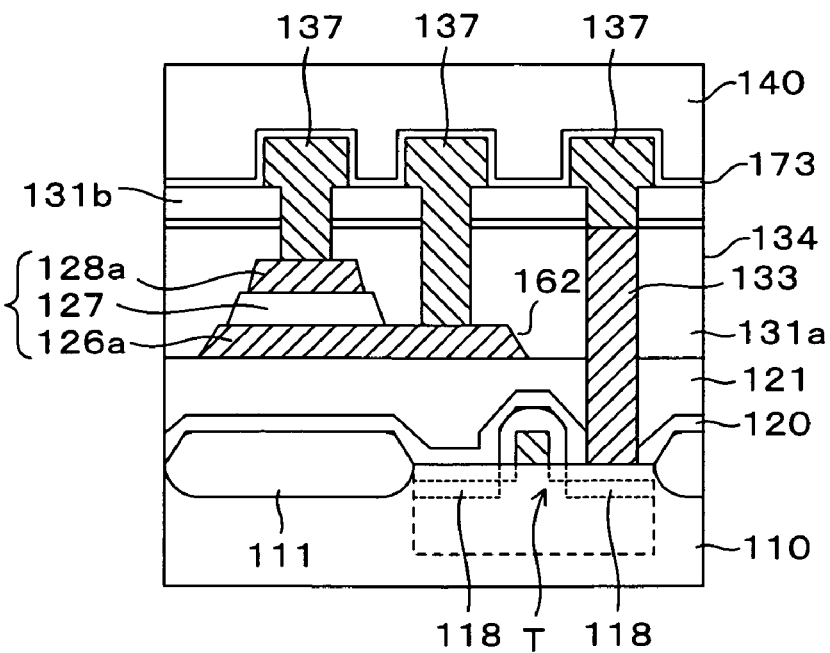
FIG. 18 is a schematic diagram showing a semiconductor device according to a 17th embodiment of the present invention.

FIG. 18 is a schematic diagram showing a semiconductor device according to a 17th embodiment of the present invention. The present embodiment is different from the first embodiment in that a hydrogen barrier layer 173 is formed on an interlayer dielectric 131*b* and interconnections 137 in a first interconnection layer. The other components of the present embodiment are basically the same as those of the first embodiment. For this reason, in FIG. 18, the same reference numerals will be used to denote the same or similar components as those in FIG. 1, so that the detailed descriptions will be omitted.

In the case of the present embodiment, after the interconnections 137 in the first interconnection layer are formed, for example, an aluminum oxide film with a thickness of approximately 20 nm is formed as the hydrogen barrier layer 173 on the entire upper surface of the resultant semiconductor substrate 110. Thereafter, as in the case of the first embodiment, an interlayer dielectric 140 made, for example, of $SiO_2$ is formed on the entire upper surface of the resultant semiconductor substrate 110.

In the case of the present embodiment, the hydrogen barrier layer 173 is formed on the interconnections 137 in the first interconnection layer as well. This enables the present embodiment to prevent degeneration of the properties of the ferroelectric capacitor 130 more securely than the first embodiment.

Note that, in the case of the semiconductor devices shown in FIG. 1 and FIGS. 3 to 17, as well, a hydrogen barrier layer may be formed, for example, of aluminum oxide on the entire upper surface of the resultant semiconductor substrate after the interconnections are formed in the first interconnection layer, as in the case of the present embodiment.

18th Embodiment

Figure 19:
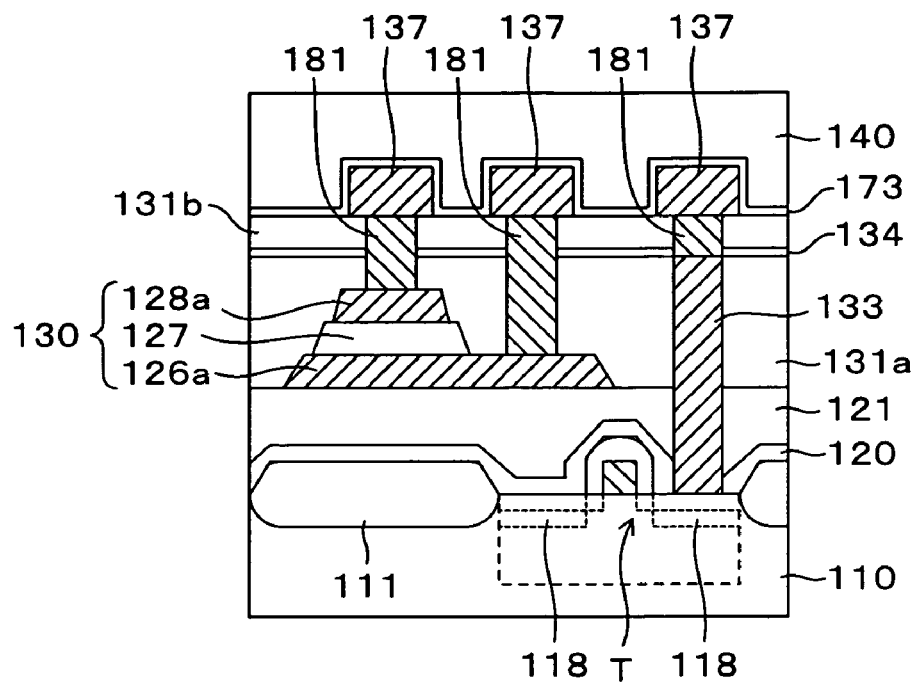
FIG. 19 is a schematic diagram showing a semiconductor device according to an 18th embodiment of the present invention.
Figure 20:
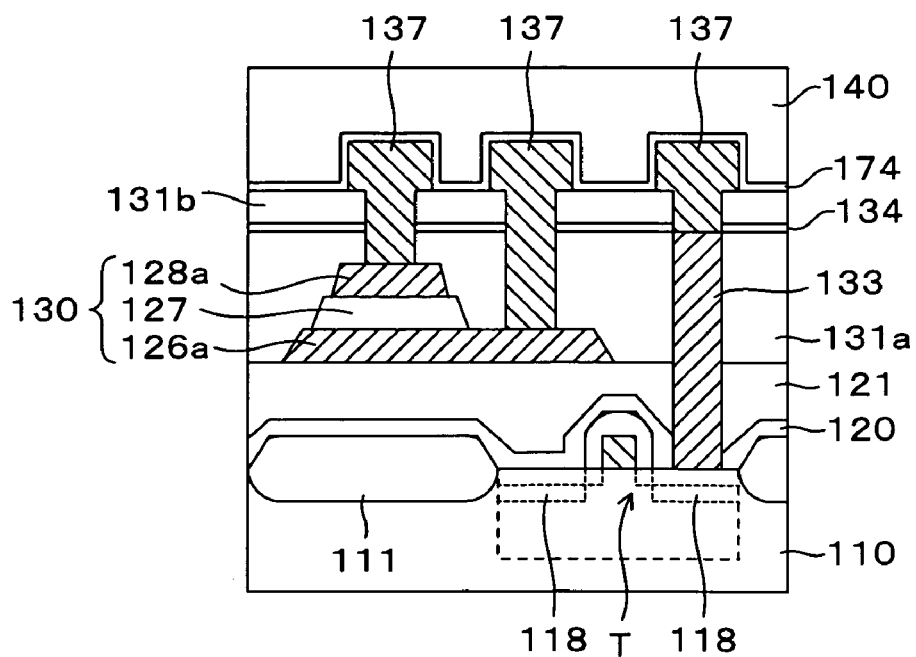

FIG. 19 is a schematic diagram showing a semiconductor device according to an 18th embodiment of the present invention. The present embodiment is different from the 17th embodiment in that interconnections 137 in a first interconnection layer are connected respectively to the upper electrode 128*a* and the lower electrode 126*a* of a ferroelectric capacitor 130 as well as W plug 133 through W plugs 181. The other components of the present embodiment are basically the same as those of the 17th embodiment. For this reason, in FIG. 19, the same reference numerals will be used to denote the same or similar components as those in FIG. 18, so that the detailed descriptions will be omitted.

In the case of the present embodiment, after a hydrogen barrier layer 134 and an interlayer dielectric 131*b* are formed, contact holes are formed. These contact holes extend from the upper surface of the interlayer dielectric 131*b*, and communicate respectively with the upper electrode 128*a*, the lower electrode 126*a* and the W plug 133. Thereafter, a Ti film with a thickness of 20 nm and a TiN film with a thickness of 50 nm (none of the films are illustrated) are sequentially formed on the entire upper surface of the resultant semiconductor substrate 110, for example, by use of the PVD method. Subsequently, W is deposited on the entire upper surface of the resultant semiconductor substrate 110, for example, by use of the CVD method. Thus, a W film is formed on the interlayer dielectric 131*b*, and concurrently W is filled in the contact holes.

After that, the W film, the TiN film and the Ti film on the interlayer dielectric 131*b* are removed by use of the CMP method. In the foregoing manner, the W plugs 181 to be connected respectively to the upper electrode 128*a*, the lower electrode 126*a* and the W plug 133 are formed.

Subsequently, an aluminum film is formed on the entire upper surface of the resultant semiconductor substrate 110. Thereafter, the aluminum film is etched, and thus interconnections 137 in a first interconnection layer are formed. After that, for example, an aluminum oxide film with a thickness of approximately 20 nm is formed as a hydrogen barrier layer 173 on the entire upper surface of the resultant semiconductor substrate 110. The present embodiment can bring about the same effect as the 17th embodiment.

19th Embodiment

Figure 20:
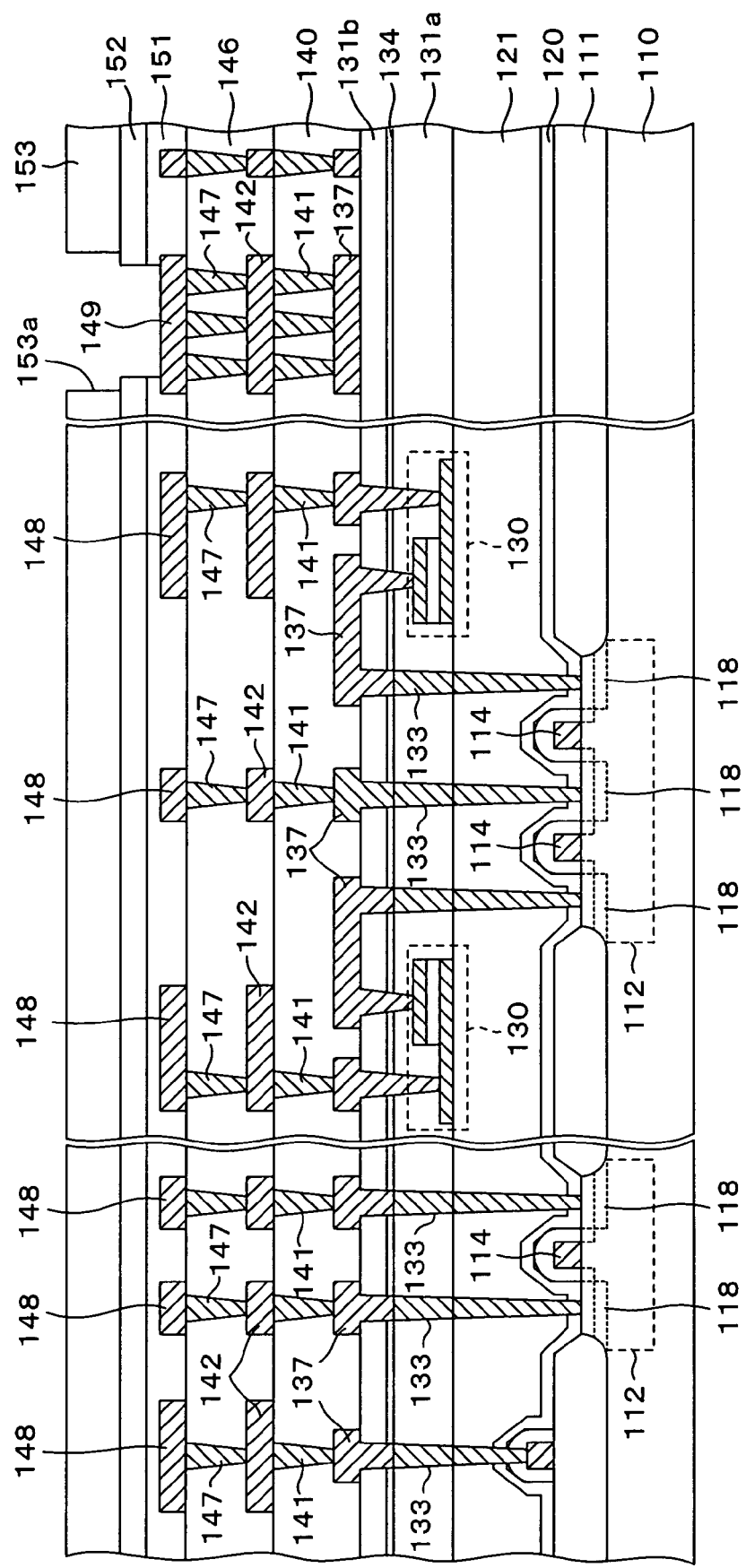
FIG. 20 is a schematic diagram showing a semiconductor device according to a 19th embodiment of the present invention.

FIG. 20 is a schematic diagram showing a semiconductor device according to a 19th embodiment of the present invention. The present embodiment is different from the 17th embodiment in that a SiO (silicon oxide) film is formed instead of a hydrogen barrier layer 173. The other components of the present embodiment are basically the same as those of the 17th embodiment. For this reason, in FIG. 20, the same reference numerals will be used to denote the same or similar components as those in FIG. 18, so that the detailed descriptions will be omitted.

In the case of the present embodiment, after interconnections 137 in a first interconnection layer are formed, a SiO film 174 is formed, for example, with a thickness of 20 nm to 50 nm on the entire supper surface of the resultant semiconductor substrate by use of the sputtering method. Thereafter, an interlayer dielectric 140 made, for example, of SiO$_2$ is formed on the entire upper surface of the resultant semiconductor substrate 110 by use of the plasma CVD method.

When the interlayer dielectric 140 is formed on the interconnections 137 in the first interconnection layer by use of the plasma CVD method, the properties of the ferroelectric capacitor 130 may degenerate in some cases. However, in the case of the present embodiment, as described above, the SiO film 174 is formed on the interconnections 137 in the first interconnection layer by use of the sputtering method, and the interlayer dielectric 140 is formed on the SiO film 174 by use of the plasma CVD method. This enables the present embodiment to prevent degeneration of the properties of the ferroelectric capacitor 130.

20th Embodiment

Figure 21:
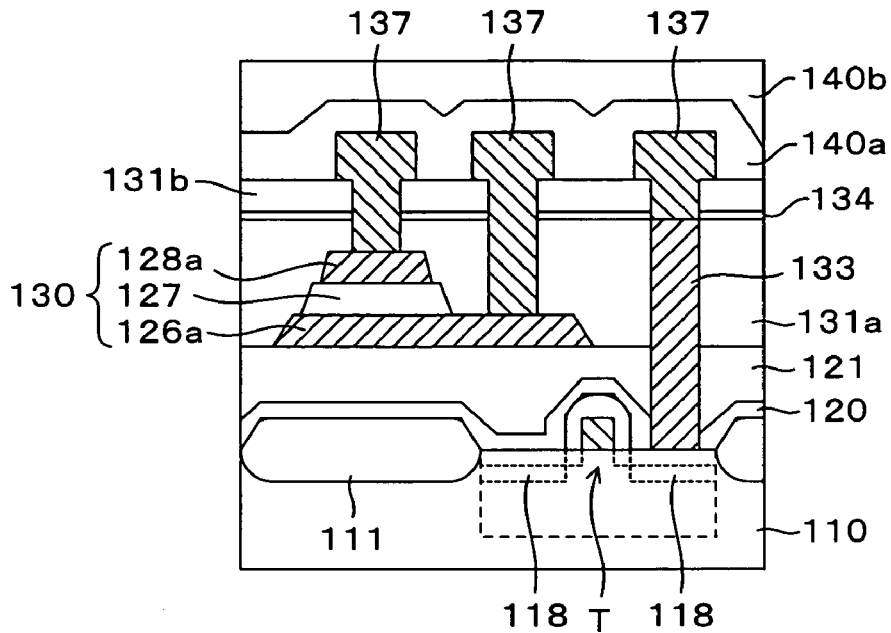
FIG. 21 is a schematic diagram showing a semiconductor device according to a 20th embodiment of the present invention.

FIG. 21 is a schematic diagram showing a semiconductor device according to a 20th embodiment of the present invention. The present embodiment is different from the first embodiment in that an interlayer dielectric between a first interconnection layer and a second interconnection layer has a multilayered structure. The other components of the present embodiment are basically the same as those of the first embodiment. For this reason, in FIG. 21, the same reference numerals will be used to denote the same or similar components as those in FIG. 1, so that the detailed descriptions will be omitted.

In the case of the present embodiment, after interconnections 137 in the first interconnection layer are formed, an application-type insulating material, for example SOG (Spin-On-Glass), is applied with a thickness of 200 nm to the entire upper surface of the resultant semiconductor substrate 110. Thereby, an insulating film 140a is formed thereon. Thereafter, an insulating film 140b made, for example, of SiO is formed with a thickness of 2500 nm on the insulating film 140a.

In the case of the present embodiment, the interlayer dielectric 140a is formed of the application-type insulating material, and thereafter the insulating film 140b is formed by use of the plasma CVD method. This makes it possible to prevent degeneration of the properties of the ferroelectric capacitor 130 due to stress during the formation of the interlayer dielectric 140b.

21st Embodiment

Figure 22:
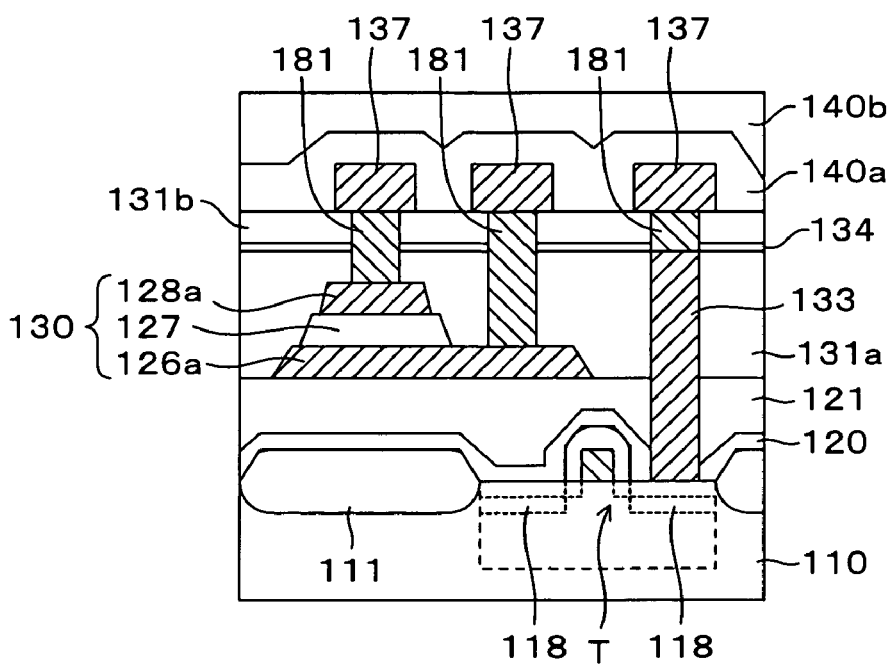
FIG. 22 is a schematic diagram showing a semiconductor device according to a 21st embodiment of the present invention.

FIG. 22 is a schematic diagram showing a semiconductor device according to a 21st embodiment of the present invention. The present embodiment is different from the 20th embodiment in that interconnections 137 in a first interconnection layer are connected respectively to the upper electrode 128a and the lower electrode 126a of a ferroelectric capacitor 130 as well as W plug 133 through W plugs 181. The other components of the present embodiment are basically the same as those of the 20th embodiment. For this reason, in FIG. 22, the same reference numerals will be used to denote the same or similar components as those in FIG. 21, so that the detailed descriptions will be omitted.

In the case of the present embodiment, after a hydrogen barrier layer 134 and an interlayer dielectric 131b are formed, contact holes are formed. These contact holes extend from the upper surface of the interlayer dielectric 131b, and communicate respectively with the upper electrodes 128a, the lower electrode 126a and the W plug 133. Thereafter, a Ti film with a thickness of 20 nm and a TiN film with a thickness of 50 nm (none of the films are illustrated) are sequentially formed on the entire upper surface of the resultant semiconductor substrate 110, for example, by use of the PVD method. Subsequently, W is deposited on the entire upper surface of the resultant semiconductor substrate 110, for example, by use of the CVD method. Thus, a W film is formed on the interlayer dielectric 131b, and concurrently W is filled in the contact holes.

After that, the W film, the TiN film and the Ti film on the interlayer dielectric 131b are removed by use of the CMP method. In the foregoing manner, the W plugs 181 to be connected respectively to the upper electrode 128a, the lower electrode 126a and the W plug 133 are formed.

Subsequently, an aluminum film is formed on the entire upper surface of the resultant semiconductor substrate 110. Thereafter, the aluminum film is etched, and thus the interconnections 137 in the first interconnection layer are formed. After that, SOG (Spin-On-Glass) is applied to the entire upper surface of the resultant semiconductor substrate 110, and thus an insulating film 140a is formed. Subsequently, an insulating film 140b made, for example, of SiO is formed on the insulating film 140a by use of the plasma CVD method. The present embodiment can bring about the same effect as the 20th embodiment.

22nd Embodiment

Figure 23:
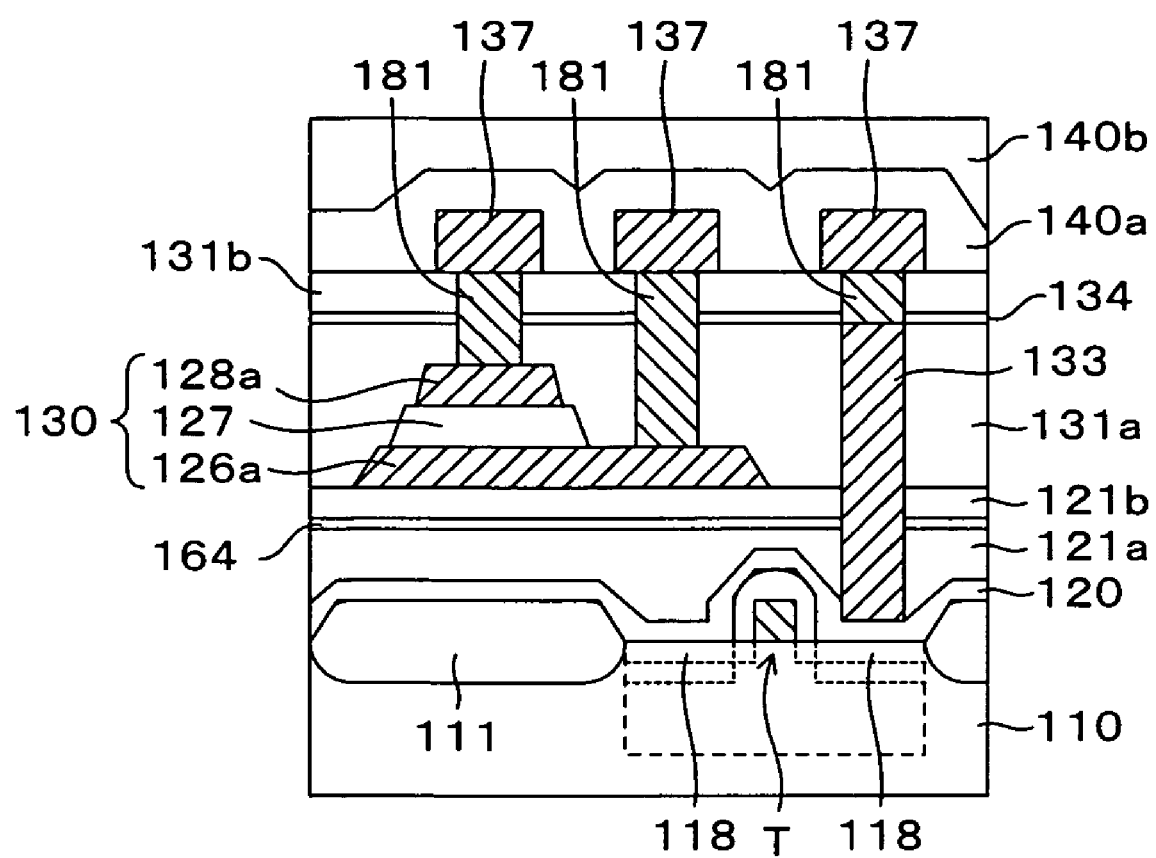
FIG. 23 is a schematic diagram showing a semiconductor device according to a 22nd embodiment of the present invention.

FIG. 23 is a schematic diagram showing a semiconductor device according to a 22nd embodiment of the present invention. The present embodiment is different from the 21st embodiment in that a hydrogen barrier layer 164 is formed below a ferroelectric capacitor 130. The other components of the present embodiment are basically the same as those of the 21st embodiment. For this reason, in FIG. 23, the same reference numerals will be used to denote the same or similar components as those in FIG. 22, so that the detailed descriptions will be omitted.

In the case of the present embodiment, after a transistor T and a stopper layer 120 are formed, TEOS is deposited with a thickness of 600 nm on the entire upper surface of the resultant semiconductor substrate 110, for example, by use of the plasma CVD method. Thus, an interlayer dielectric 121a is formed. Thereafter, aluminum oxide is deposited on the interlayer dielectric 121a, for example, by use of the PVD method. Thus, a hydrogen barrier layer 164 with a thickness of approximately 20 nm is formed.

Subsequently, TEOS is deposited with a thickness of 100 nm on the hydrogen barrier layer 164, for example, by use of the plasma CVD method. Thus, an interlayer dielectric 121b is formed.

In the case of the present embodiment, the hydrogen barrier layer 164 is provided below the ferroelectric capacitor 130 as well. This makes it possible to prevent hydrogen and moisture from entering the ferroelectric capacitor 130 from thereunder. This makes it possible to prevent degeneration of the properties of the ferroelectric capacitor 130 more securely.

Note that the other embodiments may include a hydrogen barrier layer below the ferroelectric capacitor 130 as in the case of the present embodiment.

23rd Embodiment

Figure 24:
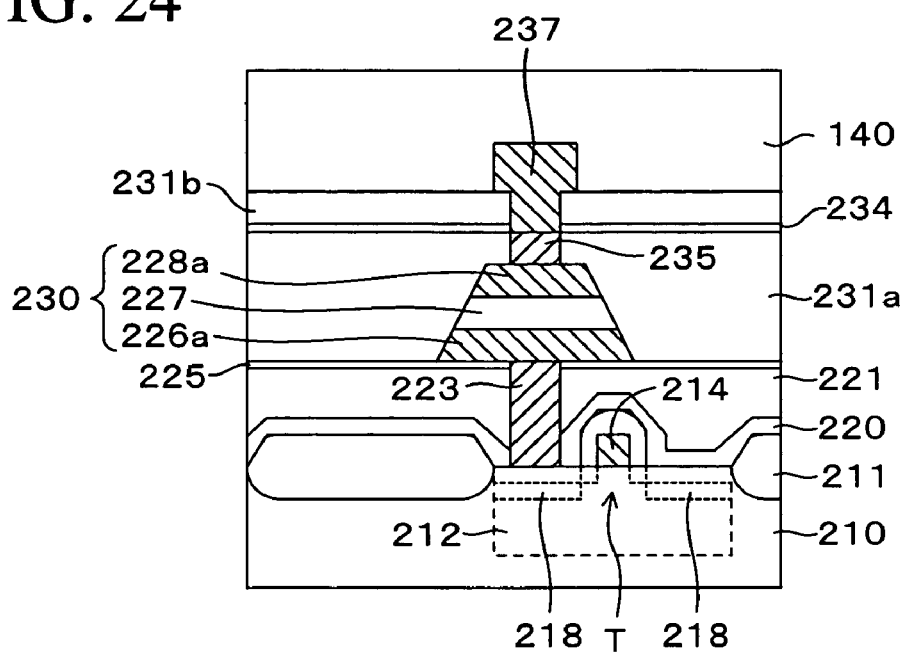
FIG. 24 is a schematic diagram showing a semiconductor device according to a 23rd embodiment of the present invention.

FIG. 24 is a schematic diagram showing a semiconductor device according to a 23rd embodiment of the present invention. The semiconductor substrate 210 is separated into a plurality of element regions by an element separation film 211. Each transistor T is configured of a pair of high-concentration impurity regions 218, a gate insulating film (not illustrated) and a gate electrode 214. The pair of high-concentration impurity regions 218 are formed by implanting impurities in the semiconductor substrate 210 selectively. The gate insulating film is formed on a region between the pair of high-concentration impurity regions 218. The gate electrode 214 is formed on the gate insulating film. A stopper layer 220 is formed on the semiconductor substrate 210. The transistors T and the element separation film 211 are covered with the stopper layer 220. In addition, an interlayer dielectric (first insulating film) 221 is formed on the stopper layer 220.

Each ferroelectric capacitor 230 is formed above the interlayer dielectric 221. Each ferroelectric capacitor 230 has a structure in which a lower electrode 226a, a ferroelectric film 227 and an upper electrode 228a are stacked on one another in this order from the bottom. The lower electrode 226a of each ferroelectric capacitor 230 is electrically connected to one of the pair of high-concentration impurity regions 218 of the corresponding transistor T through a W plug 223 formed underneath the lower electrode 226a.

An interlayer dielectric (second insulating film) 231a is formed above the interlayer dielectric 221 and on the ferroelectric capacitor 230. A planarization process is applied to the upper surface of the interlayer dielectric 231a. A contact hole is formed in the interlayer dielectric 231a. The contact hole extends from the upper surface of the interlayer dielectric 231a, and communicates with the upper electrode 228a of the ferroelectric capacitor 230. A W (tungsten) plug 235 is formed of W embedded in the contact hole.

A hydrogen barrier layer 234 made of aluminum oxide is formed on the interlayer dielectric 231a. Another interlayer dielectric (third insulating film) 231b is formed on the hydrogen barrier layer 234. Interconnections 237 in a first interconnection layer are formed on the interlayer dielectric 231b. Predetermined interconnections of the interconnections 237 in the first interconnection layer are electrically connected respectively to the W plug 235 through corresponding contact holes formed by etching the interlayer dielectric 231b and the hydrogen barrier layer 234.

Yet another interlayer dielectric 140 is formed on the interlayer dielectric 231b and the interconnections 237 in the first interconnection layer. The interconnection structure above the first interconnection layer of the present embodiment is the same as that of the first embodiment, so that the descriptions will be omitted.

Figure 25:
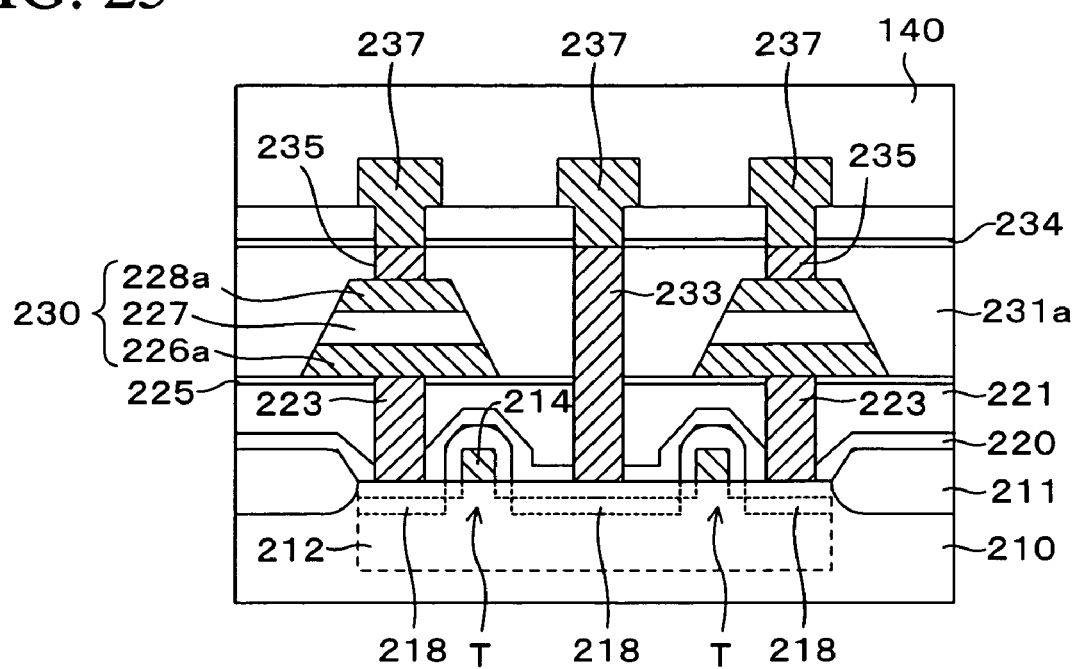
FIG. 25 is a cross-sectional view showing a method of manufacturing the semiconductor device according to the 23rd embodiment of the present invention.

FIG. 25 is a cross-sectional view showing an example in which the foregoing structure is applied to a stacked-type FeRAM. Referring to FIG. 25, descriptions will be provided for a method of manufacturing the semiconductor device according to the present embodiment. Incidentally, FIG. 25 illustrates only a structure of a memory cell.

First of all, in the same manner as is taken for the first embodiment, element separation films 211 are formed, and thus a semiconductor substrate is separated into a plurality of element regions by the element separation films 211. Thereafter, impurities are introduced into the semiconductor substrate 210, and thus a well region 212 is formed. Subsequently, gate insulating films (not illustrated) and gate electrodes 214 are formed on semiconductor substrate. After that, impurities are introduced into the resultant semiconductor substrate 210. Thereby, high-concentration impurity regions 218 are formed. These high-concentration impurity regions serve as sources/drains of transistors T.

Thereafter, a stopper layer 220 made, for example, of SiON is formed with a thickness of approximately 200 nm on the entire upper surface of the resultant semiconductor substrate 210. Subsequently, an interlayer dielectric 221 is formed with a thickness of approximately 600 nm on the stopper layer 220. After that, the interlayer dielectric 221 is polished by approximately 200 nm from the top surface thereof, and thus the upper surface thereof is planarized. Thereafter, a SiON film 225 is formed, for example, with a thickness of 100 nm on the planarized upper surface of the interlayer dielectric 221. The SiON film 225 will be used later as a protection film when a recovery annealing process is applied to the resultant semiconductor substrate 210 by use of oxygen in a subsequent step.

Thereafter, contact holes are formed in a region for forming a ferrolectric capacitor by use of the photolithographic method and the etching method. These contact holes extend from the upper surface of the interlayer dielectric 221, and respectively reach the high-concentration impurity regions 218. Subsequently, W (tungsten) is embedded in these contact holes, and thus W plugs 223 are formed.

After that, a conductor film and a ferroelectric film 227 are formed on the entire upper surface of the resultant semiconductor substrate 210. The conductor film will serve as lower electrodes 226a respectively of ferroelectric capacitors 230. Thereafter, the ferroelectric film 227 is crystallized by the RTA process in an oxygen atmosphere. Subsequently, a conductor film is formed on the ferroelectric film 227. The conductor film will serve as upper electrodes 228a respectively of the ferroelectric capacitors 230. After that, these conductor films and the ferroelectric film 227 are patterned, and thus the ferroelectric capacitors 230 are formed. Thereafter, the recovery annealing process is applied to the ferroelectric films 227. This recovery annealing process is carried out by heating the ferroelectric films 227, for example, at a temperature of 350° C. in an oxygen atmosphere.

Subsequently, an interlayer dielectric 231a is formed on the entire upper surface of the resultant semiconductor substrate 210. After that, this interlayer dielectric 231a is polished by CMP, and thus the upper surface thereof is planarized. Thereafter, a photoresist film is formed on the interlayer dielectric 231a. Then, the photoresist film is exposed to light, and is developed. Thus, opening portions through which to expose the interlayer dielectric 231a to the outside are formed in predetermined positions. The resultant semiconductor substrate 210 is etched by using this photoresist film as the mask, and thus contact holes are formed. These contact holes extend from the upper surface of the interlayer dielectric 231a, and respectively reach the upper electrodes 228a respectively of the ferroelectric capacitors 230. Subsequently, the photoresist film is removed therefrom. Thereafter, a recovery annealing process is applied to the ferroelectric films 227 for the purpose of recovering the ferroelectric films 227 from damages caused during the etching process.

Thereafter, another photoresist film is formed on the interlayer dielectric 231a once again. Subsequently, this photoresist film is exposed to light, and is developed. Thus, opening portions through which to expose the interlayer dielectric 231a to the outside are formed in predetermine positions. After that, the resultant semiconductor substrate 210 is etched by using this photoresist film as the mask, and thus contact holes are formed. These contact holes extend from the upper surface of the interlayer dielectric 231a, and respectively reach predetermined high-concentration impurity regions 218 in the surface of the semiconductor substrate 210. Subsequently, the photoresist film is removed. Thereafter, W (tungsten) is embedded in these contact holes. Thus, W plugs 235 and a W plug 233 are formed. The W plugs 235 are connected to the upper electrodes 228a respectively of the ferroelectric capacitors 230. The W plug 233 is connected to the high concentration impurity region 218 in the surface of the semiconductor substrate 210.

After that, an aluminum oxide film is formed as a hydrogen barrier layer 234, for example, with a thickness of 20 nm on the interlayer dielectric 231a, the W plug 233 and the W plugs 235. Subsequently, an interlayer dielectric 231b is formed with a thickness of 100 nm on the aluminum oxide film. Thereafter, contact holes are formed by use of the photolithographic method and the etching method. These contact holes extend from the upper surface of the interlayer dielectric 231b, and respectively reach the W plug 233 and the W plugs 235.

Subsequently, an aluminum film is formed on the entire upper surface of the resultant semiconductor substrate 210. Thereafter, the aluminum film is patterned, and thus interconnections 237 in a first interconnection layer are formed. Subsequent manufacturing steps are the same as those of the first embodiment. For this reason, the descriptions will be omitted.

In the case of the present embodiment, the annealing of the ferroelectric films 227 is completed before the W plug 233 is formed, as well. This makes unnecessary a step of forming an insulating film which would otherwise be needed to prevent the W plug 233 from being oxidized, and a step of removing the insulating film. This brings about an effect of making the steps for manufacturing the FeRAM simpler than before.

In the case of this embodiment, the upper surface of the interlayer dielectric 231a covering the ferroelectric capacitors 230 is planarized, and the hydrogen barrier layer 234 is formed on the planarized upper surface thereof. This makes it possible to prevent hydrogen and moisture from entering the ferroelectric capacitors 230 from the outside. This enhances reliability of the FeRAM.

In the case of the present embodiment, a SiO film may be also formed on the interlayer dielectric 231b by use of the sputtering method, as described with regard to the 19th embodiment (refer to FIG. 20). In addition, it also serves the purpose that an insulating film may be formed of an application-type insulating material on the interlayer dielectric 231b, followed by forming another interlayer dielectric on the interlayer dielectric 231b by use of the plasma CVD method, as described with regard to the 20th embodiment (refer to FIG. 21).

24th Embodiment

Figure 26:
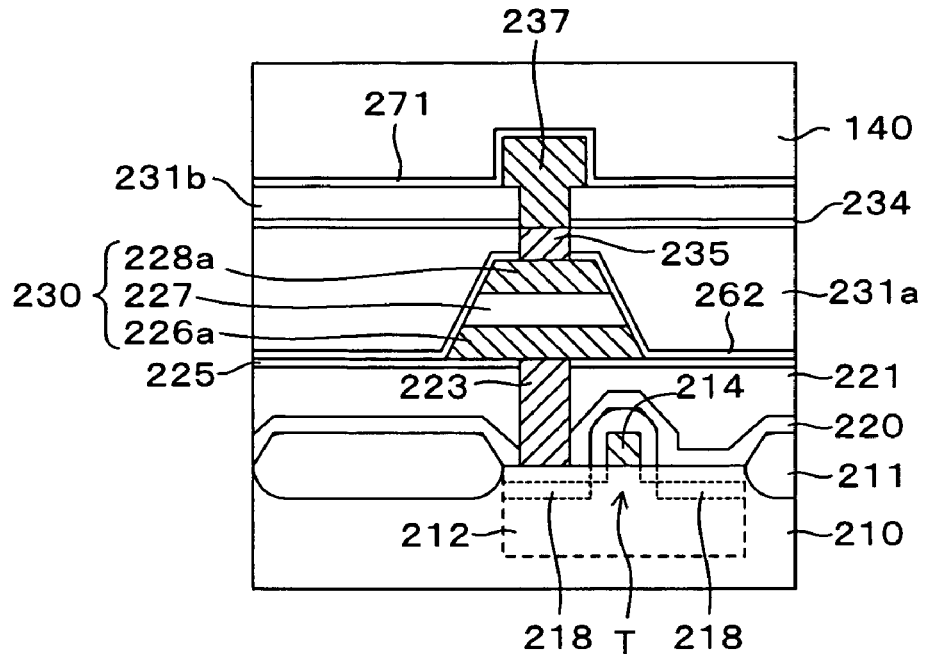
FIG. 26 is a schematic diagram showing a semiconductor device according to 24th embodiment of the present invention.

FIG. 26 is a schematic diagram showing a semiconductor device according to a 24th embodiment of the present invention. The present embodiment is different from the 23rd embodiment in that a hydrogen barrier layer 262 is formed on a ferroelectric capacitor 230, and in that a hydrogen barrier layer 271 is formed on an interlayer dielectric 231b and interconnections 237 in a first interconnection layer as well. The other components of the present embodiment are basically the same as those of the 23rd embodiment. For this reason, in FIG. 26, the same reference numerals will be used to denote the same or similar components as those in FIG. 24, so that the detailed descriptions will be omitted.

In the case of the present embodiment, after the ferroelectric capacitor 230 is formed, for example, an aluminum oxide film is formed as a hydrogen barrier layer 262 with a thickness of approximately 20 nm on the entire upper surface of the resultant semiconductor substrate 210. Thereafter, as in the case of the 23rd embodiment, an interlayer dielectric 231a, W plugs 235 (plus a W plug 233: refer to FIG. 25), a hydrogen barrier layer 234, an interlayer dielectric 231b, and interconnections 237 in a first interconnection layer are formed. Subsequently, for example, an aluminum oxide film is formed as a hydrogen barrier layer 271 with a thickness of approximately 20 nm on the entire upper surface of the resultant semiconductor substrate 210.

The present embodiment can bring about the same effect as the 23rd embodiment. In addition, the present embodiment makes it possible to prevent degeneration of the properties of the ferroelectric capacitor 230 more securely than the 23rd embodiment. This is because the semiconductor device of the present embodiment is provided with the hydrogen barrier layer 262 covering the ferroelectric capacitor 230, and the hydrogen barrier layer 271 covering the interlayer dielectric 231b and the interconnections 237 in the first interconnection layer.

25th Embodiment

Figure 27:
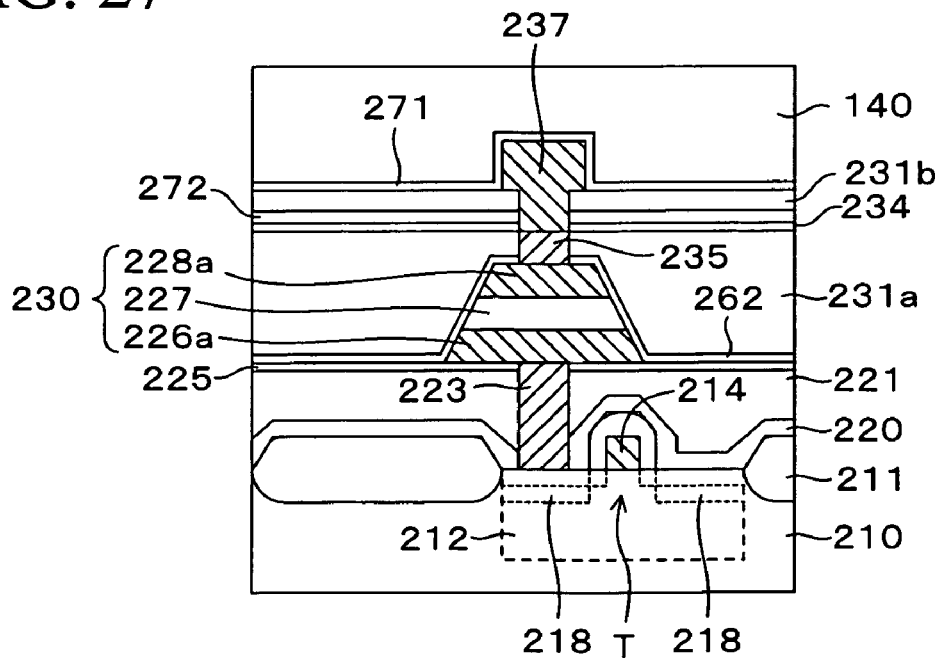
FIG. 27 is a schematic diagram showing a semiconductor device according to 25th embodiment of the present invention.

FIG. 27 is a schematic diagram showing a semiconductor device according to a 25th embodiment of the present invention. The present embodiment is different from the 24th embodiment in that a moisture barrier layer 272 is formed on a hydrogen barrier layer 234. The other components of the present embodiment are basically the same as those of the 24th embodiment. For this reason, in FIG. 27, the same reference numerals will be used to denote the same or similar components as those in FIG. 26, so that the detailed descriptions will be omitted.

In the case of the present embodiment, after an interlayer dielectric 231a and W plugs 235 (plus a W plug 233: refer to FIG. 25) are formed, the hydrogen barrier layer 234 is formed. Subsequently, for example, a SiN film or a SiON film is formed as the moisture barrier layer 272 with a thickness of 50 nm on the hydrogen barrier layer 234. Thereafter, an interlayer dielectric 231b is formed. Then, a contact hole is formed. The contact hole extends from the upper surface of the interlayer dielectric 231b, and reaches the W plugs 235 (plus the W plug 233: refer to FIG. 25). Subsequently, an aluminum film is formed on the entire upper surface of the resultant semiconductor substrate 210. Thereafter, the aluminum film is patterned, and thus interconnections 237 in a first interconnection layer are formed.

In the case of the present embodiment, the moisture barrier layer 272 is formed in addition to the hydrogen barrier layer 234. This enables the present embodiment to prevent degeneration of the properties of the ferroelectric capacitor 230 more securely than the 24th embodiment.

In the case of the present embodiment, the moisture barrier layer 272 is formed on the hydrogen barrier layer 234. However, it also serve the purpose that the moisture barrier layer 272 is formed, followed by forming the hydrogen barrier layer 234 on the moisture barrier layer 272.

26th Embodiment

Figure 28:
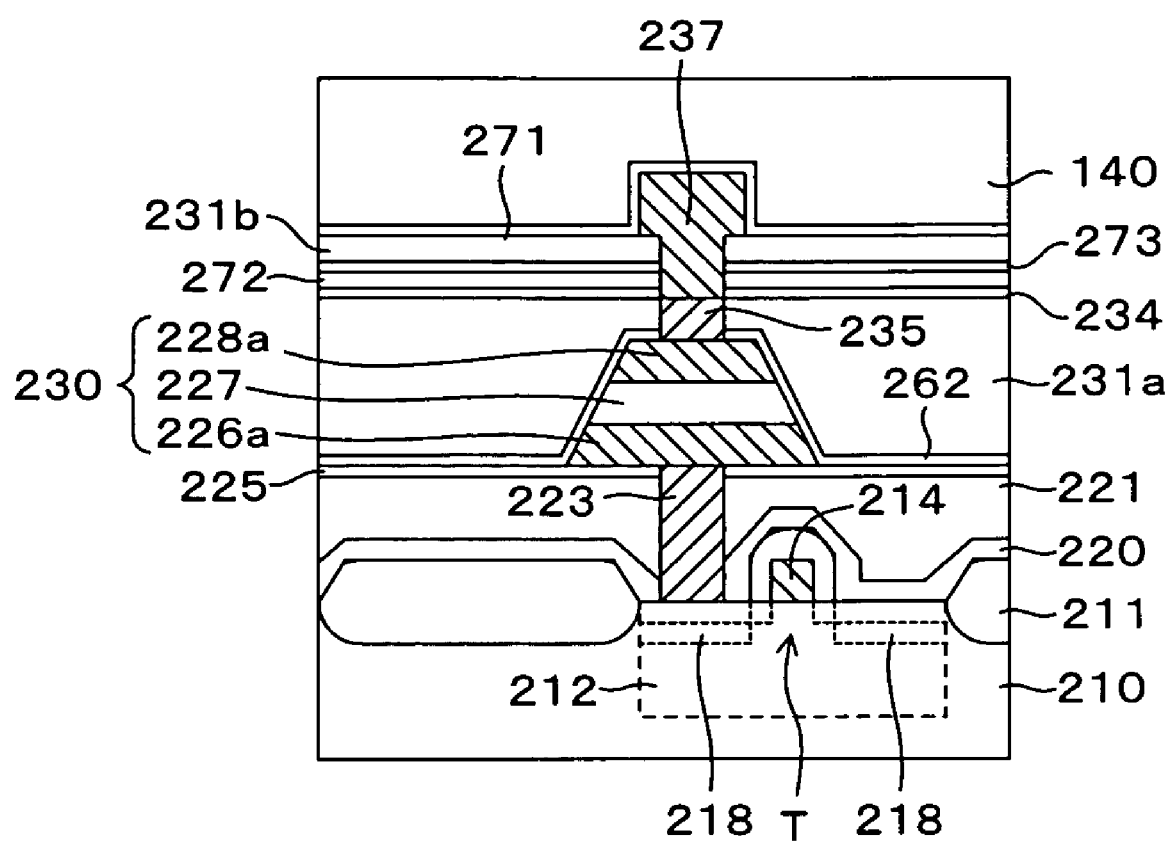
FIG. 28 is a schematic diagram showing a semiconductor device according to 26th embodiment of the present invention.

FIG. 28 is a schematic diagram showing a semiconductor device according to a 26th embodiment of the present invention. The present embodiment is different from the 24th embodiment in that a moisture barrier layer 272 and a hydrogen barrier layer 273 are formed on a hydrogen barrier layer 234. The other components of the present embodiment are basically the same as those of the 24th embodiment. For this reason, in FIG. 28, the same reference numerals will be used to denote the same or similar components as those in FIG. 26, so that the detailed descriptions will be omitted.

In the case of the present embodiment, after an interlayer dielectric 231a and W plugs 235 (plus a W plug 233: refer to FIG. 25) are formed, the hydrogen barrier layer 234 is formed. Subsequently, for example, a SiN film or a SiON film is formed as the moisture barrier layer 272 with a thickness of 50 nm on the hydrogen barrier layer 234. Thereafter, for example, an aluminum oxide film is formed as the hydrogen barrier layer 273 with a thickness of approximately 20 nm on the moisture barrier layer 272.

Subsequently, an interlayer dielectric 231b is formed on the hydrogen barrier layer 273. Thereafter, a contact hole is formed. The contact hole extends from the upper surface of the interlayer dielectric 231b, and reaches the W plugs 235 (plus the W plug 233: refer to FIG. 25). After that, an aluminum film is formed on the entire upper surface of the resultant semiconductor substrate 210. Thereafter, this aluminum film is patterned, and thus interconnections 237 in a first interconnection layer are formed.

In the case of the present embodiment, the moisture barrier layer 272 and the hydrogen barrier layer 273 are formed in addition to the hydrogen barrier layer 234. This enables the present embodiment to prevent degeneration of the properties of the ferroelectric capacitor 230 more securely than the 24th embodiment.

Other Embodiments

Figure 29:
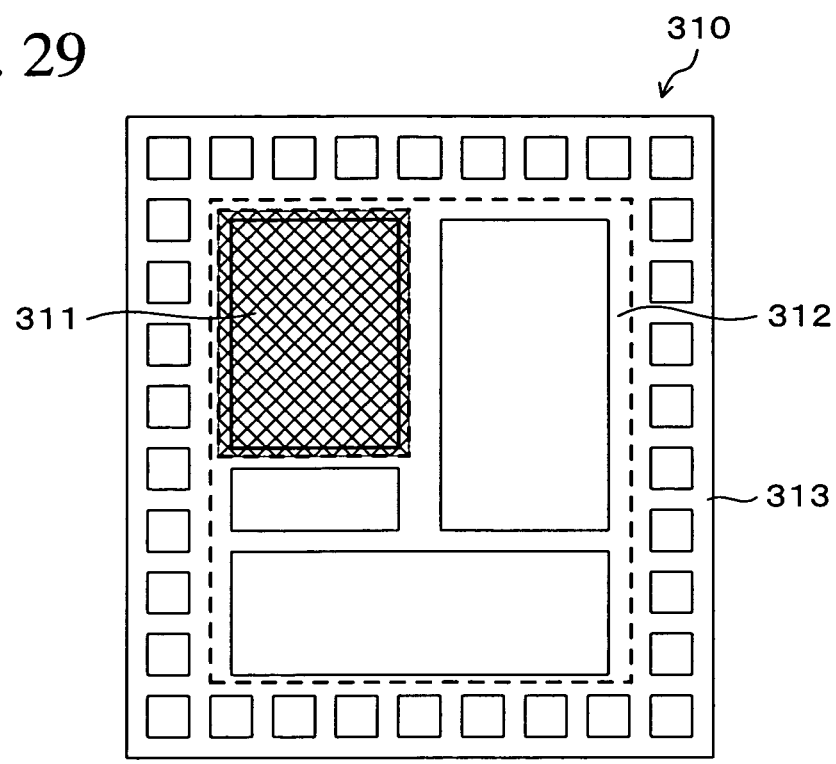
FIG. 29 is a top view showing an example in which a hydrogen barrier layer is arranged on only a part of a semiconductor substrate.

None of the first to the 26th embodiments includes a step of patterning the hydrogen barrier layers. In addition, the hydrogen barrier layers are formed on the entire upper surface of the resultant semiconductor substrate in the respective manufacturing steps in each of the first to the 26th embodiments. However, the hydrogen barrier layers may be arranged only in a part of the resultant semiconductor substrate, as shown in FIG. 29. FIG. 29 is a top view showing a region 310 for forming a chip, the region corresponding to one chip in the semiconductor substrate. Reference numeral 311 denotes a region for forming a memory cell; 312, a region for forming a peripheral circuit; and 313, a region for forming terminals. FIG. 29 shows an example in which the hydrogen barrier layers are arranged in a meshed part, that is, the region 311 for forming a memory cell.

Figure 30:
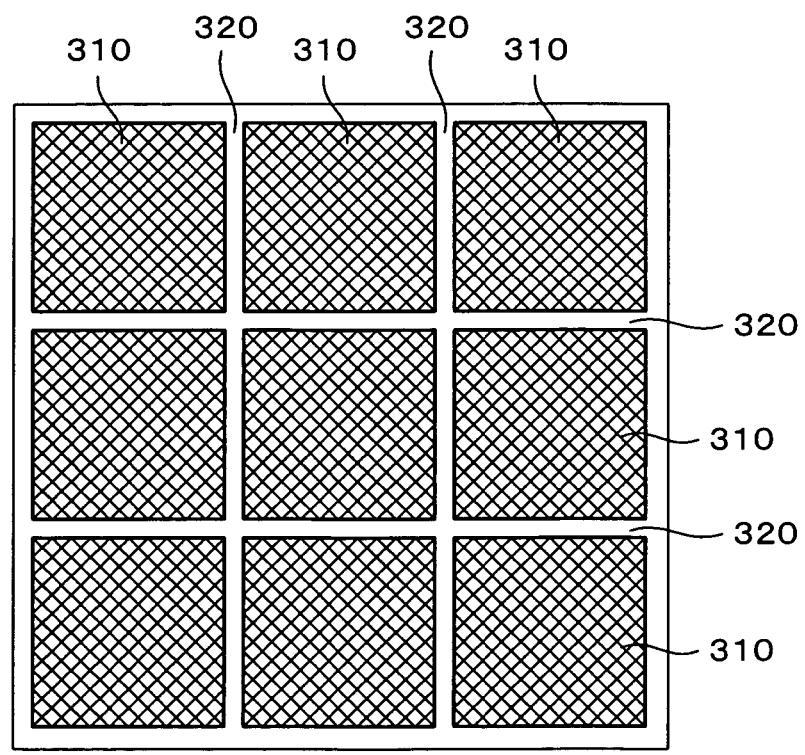
FIG. 30 is a top view showing an example where a hydrogen barrier layer is removed from a scribe region by etching after the hydrogen barrier layer (otherwise both the hydrogen barrier layer and a moisture barrier layer) is formed entirely above the semiconductor substrate.

In addition, it also serves the purpose that a hydrogen barrier layer (otherwise, a hydrogen barrier layer and a moisture barrier layer) is formed on the entire upper surface of the resultant semiconductor substrate, followed by removing the hydrogen barrier layer from scribe regions 320 by etching, as shown FIG. 30.

In a case where a plurality of hydrogen barrier layers are intended to be formed, or in a case where a moisture barrier layer is intended to be formed in addition to a hydrogen barrier layer, it also serves the purpose that, similarly, the hydrogen barrier layers (otherwise, the hydrogen barrier layer and the moisture barrier layer) are formed on the entire upper surface of the resultant semiconductor substrate, followed by removing the hydrogen barrier layers from regions other than the memory cells, or from regions other than the scribe regions, by etching.

What is claimed is:

1. A method of manufacturing a semiconductor device, comprising:
   forming a transistor on a semiconductor substrate;
   forming a first insulating film, covering the transistor, on the semiconductor substrate;
   forming a ferroelectric capacitor on the first insulating film, the ferroelectric capacitor being configured of a lower electrode, a ferroelectric film and an upper electrode;
   forming a second insulating film, covering the ferroelectric capacitor, on the first insulating film;
   planarizing an upper surface of the second insulating film;
   forming a first contact hole all at once after the planarizing, the first contact hole extending from an upper surface of the second insulating film, and reaching one of a plurality of impurity regions constituting the transistor;
   forming a plug by embedding a conductor in the first contact hole, the plug being electrically connected to the impurity region;
   forming a first hydrogen barrier layer on the second insulating film, the first hydrogen barrier layer being that which prevents hydrogen and moisture from entering a portion under the first hydrogen barrier layer;
   forming a third insulating film on the first hydrogen barrier layer;
   forming second contact holes which extend from an upper surface of the third insulating film, and which respectively reach the upper electrode and the lower electrode of the ferroelectric capacitor;
   performing a recovery annealing process on the ferroelectric capacitor;
   forming a third contact hole which extends from the upper surface of the third insulating film, and which reaches the plug; and
   forming interconnections on the third insulating film, two of the interconnections being electrically connected respectively to the upper electrode and the lower electrode of the ferroelectric capacitor through the second contact holes, and another one of the interconnections other than the two of the interconnections being electrically connected to the plug through the third contact hole.

2. The method of manufacturing a semiconductor device as recited in claim 1, wherein the first hydrogen barrier layer is formed of any one selected from the group consisting of aluminum oxide, titanium oxide, tantalum oxide, zirconia, aluminum nitride, tantalum nitride and aluminum oxynitride.

3. The method of manufacturing a semiconductor device as recited in claim 1, wherein a fourth insulating film is formed on the third insulating film by sputtering.

4. The method of manufacturing a semiconductor device as recited in claim 1, wherein a fourth insulating film is formed on the third insulating film.

* * * * *